US008773891B2

(12) United States Patent
Li et al.

(10) Patent No.: US 8,773,891 B2
(45) Date of Patent: Jul. 8, 2014

(54) SYSTEMS, METHODS, AND DEVICES WITH WRITE OPTIMIZATION IN PHASE CHANGE MEMORY

(71) Applicant: Being Advanced Memory Corporation, Essex Junction, VT (US)

(72) Inventors: Yuanxing Li, Essex Junction, VT (US); Van Butler, Essex Junction, VT (US); Ryan Jurasek, Burlington, VT (US)

(73) Assignee: Being Advanced Memory Corporation, Williston, VT (US)

( * ) Notice: Subject to any disclaimer, the term of this patent is extended or adjusted under 35 U.S.C. 154(b) by 0 days.

(21) Appl. No.: 14/011,266

(22) Filed: Aug. 27, 2013

(65) Prior Publication Data
US 2014/0071748 A1  Mar. 13, 2014

Related U.S. Application Data

(60) Provisional application No. 61/698,539, filed on Sep. 7, 2012, provisional application No. 61/784,341, filed on Mar. 14, 2013, provisional application No. 61/829,579, filed on May 31, 2013.

(51) Int. Cl.
*G11C 11/00* (2006.01)
*G11C 13/00* (2006.01)

(52) U.S. Cl.
CPC .................. *G11C 13/0004* (2013.01)
USPC ........................................................ 365/148

(58) Field of Classification Search
CPC ................... G11C 13/0004; G11C 13/0069
USPC ...................................................... 365/148
See application file for complete search history.

(56) References Cited

U.S. PATENT DOCUMENTS 7,907,437 B2 * 3/2011 Lee et al. ..................... 365/148
2011/0261613 A1  10/2011 Pyeon
(Continued)

FOREIGN PATENT DOCUMENTS

CN  102270505 A  12/2011
CN  102332302 A  1/2012
(Continued)

OTHER PUBLICATIONS

Sangyeun Cho et al., "Flip-N-Write: A Simple Deterministic Technique to Improve PRAM Write Performance, Energy and Endurance," 42nd Annual IEEE/ACM International Symposium on Microarchitecture, Dec. 12-16, 2009, pp. 347-357.

(Continued)

*Primary Examiner* — Anthan Tran
(74) *Attorney, Agent, or Firm* — Gwendolyn S.S. Groover; Robert O. Groover, III

(57) ABSTRACT

Methods and systems for phase change memories and arrays with improved write characteristics. If a data word can be more efficiently written by e.g. exchanging SETs and RESETs, it is written as such on the fly, and e.g. a bit of overhead is written to indicate the transformation. This has a surprising synergy with phase change memory as SET operations usually take longer and consume more power than do RESET operations. In one sample embodiment of multilevel phase change memory, states intermediate between SET and RESET can be even less desirable to write than SETs, as they take more precision than do the extreme states of SET and RESET, so that a desirable transformation can be to exchange intermediate states for extreme states.

20 Claims, 24 Drawing Sheets

(56) References Cited

U.S. PATENT DOCUMENTS

| | | |
|---|---|---|
| 2011/0261616 A1* | 10/2011 | Kim .............................. 365/163 |
| 2011/0317480 A1* | 12/2011 | Lung et al. ................... 365/163 |
| 2012/0026786 A1 | 2/2012 | Castro et al. |
| 2012/0072657 A1 | 3/2012 | Lee et al. |

FOREIGN PATENT DOCUMENTS

| | | |
|---|---|---|
| CN | 102594315 A | 7/2012 |
| CN | 102637453 A | 8/2012 |
| CN | 103165179 A | 6/2013 |
| CN | 103165181 A | 6/2013 |

OTHER PUBLICATIONS

KIPO, International Search Report for PCT/US13/56831.

KIPO, Written Opinion for PCT/US13/56831.

* cited by examiner

| | State | | | | | | | | | | | |
|---|---|---|---|---|---|---|---|---|---|---|---|---|
| Decimal | 0 | 1 | 2 | 3 | 4 | 5 | 6 | 7 | 8 | 9 | 10 | 11 |
| Multi-bit code | 000 | 001 | 002 | 003 | 010 | 011 | 012 | 013 | 020 | 021 | 022 | 023 |
| 0 | 0 | 0 | 0 | 0 | 0 | 0 | 1 | 1 | 1 | 1 | 1 | 1 |
| 1 | 1 | 1 | 2 | 2 | 3 | 3 | 0 | 0 | 2 | 2 | 3 | 3 |
| 2 | 2 | 3 | 1 | 3 | 1 | 2 | 2 | 3 | 0 | 3 | 0 | 2 |
| 3 | 3 | 2 | 3 | 1 | 2 | 1 | 3 | 2 | 3 | 0 | 2 | 0 |

| | State | | | | | | | | | | | |
|---|---|---|---|---|---|---|---|---|---|---|---|---|
| Decimal | 12 | 13 | 14 | 15 | 16 | 17 | 18 | 19 | 20 | 21 | 22 | 23 |
| Multi-bit code | 030 | 031 | 032 | 033 | 100 | 101 | 102 | 103 | 110 | 111 | 112 | 113 |
| 0 | 2 | 2 | 2 | 2 | 2 | 2 | 3 | 3 | 3 | 3 | 3 | 3 |
| 1 | 0 | 0 | 1 | 1 | 3 | 3 | 0 | 0 | 1 | 1 | 2 | 2 |
| 2 | 1 | 3 | 0 | 3 | 0 | 1 | 1 | 2 | 0 | 2 | 0 | 1 |
| 3 | 3 | 1 | 3 | 0 | 1 | 0 | 2 | 1 | 2 | 0 | 1 | 0 |

SYSTEMS, METHODS, AND DEVICES WITH WRITE OPTIMIZATION IN PHASE CHANGE MEMORY

CROSS-REFERENCE

Priority is claimed from U.S. 61/698,539 filed Sep. 7, 2012, which is hereby incorporated by reference.

Priority is claimed from U.S. 61/784,341 filed Mar. 14, 2013, which is hereby incorporated by reference.

Priority is claimed from U.S. 61/829,579 filed May 31, 2013, which is hereby incorporated by reference.

The following four applications, including the present application, share a common assignee, all have a common effective filing date (and are therefore co-pending), and share at least some overlapping inventorship. All of these applications, and all of their direct and indirect parent applications, are hereby incorporated by reference: U.S. application Ser. No. 14/011,327 filed herewith; U.S. application Ser. No. 14/011,306 filed herewith; U.S. application Ser. No. 14/011,403 filed herewith; and U.S. application Ser. No. 14/011,266 filed herewith. Applicant reserves the right to claim priority back to all of these, in the US and/or in any other country where such priority can legally be claimed.

BACKGROUND

The present application relates to phase-change memories, and more particularly to phase-change memories in which at least one type of write operation is more favorable.

Note that the points discussed below may reflect the hindsight gained from the disclosed inventions, and are not necessarily admitted to be prior art.

Phase change memory ("PCM") is a relatively new nonvolatile memory technology, which is very different from any other kind of nonvolatile memory. First, the fundamental principles of operation, at the smallest scale, are different: no other kind of solid-state memory uses a reversible PHYSICAL change to store data. Second, in order to achieve that permanent physical change, an array of PCM cells has to allow read, set, and reset operations which are all very different from each other. The electrical requirements of the read, set, and reset operations make the peripheral circuit operations of a PCM very different from those of other nonvolatile memories. Obviously some functions, such address decoding and bus interface, can be the same; but the closest-in parts of the periphery, which perform set, reset, and read operations on an array or subarray, must satisfy some unique requirements.

The physical state of a PCM cell's memory material is detected as resistance. For each selected cell, its bitline is set to a known voltage, and the cell's access transistor is turned on (by the appropriate wordline). If the cell is in its low-resistance state, it will sink a significant current from the bit line; if it is not, it will not.

Set and Reset operations are more complicated. Both involve heat. As discussed below, a "set" operation induces the memory material to recrystallize into its low-resistance (polycrystalline) state; a "reset" operation anneals the memory material into its high-resistance (amorphous) state.

Write operations (Set and Reset) normally have more time budget than read operations. In read mode a commercial PCM memory should be competitive with the access speed (and latency if possible) of a standard DRAM. If this degree of read speed can be achieved, PCM becomes very attractive for many applications.

The phase change material is typically a chalcogenide glass, using amorphous and crystalline (or polycrystalline) phase states to represent bit states.

A complete PCM cell can include, for example: a top electrode (connected to the bit line), a phase change material (e.g. a chalcogenide glass), a conductive pillar which reaches down from the bottom of the phase change material, an access transistor (gated by a word line), and a bottom connection to ground. The phase change material can extend over multiple cells (or over the whole array), but the access transistors are laterally isolated from each other by a dielectric.

FIG. 2A shows an example of a PCM element 2010. A top electrode 2020 overlies a phase change material 2030, e.g. a chalcogenide glass. Note that material 2030 also includes a mushroom-shaped annealed zone (portion) 2070 within it. (The annealed zone 2070 may or may not be present, depending on what data has been stored in this particular location.) The annealed zone 2070, if present, has a much higher resistivity than the other (crystalline or polycrystalline) parts of the material 2030.

A conductive pillar 2050 connects the material 2030 to a bottom electrode 2040. In this example, no selection device is shown; in practice, an access transistor would normally be connected in series with the phase change material. The pillar 2050 is embedded in an insulator layer 2060.

When voltage is applied between the top 2020 and bottom 2040 electrodes, the voltage drop will appear across the high-resistivity zone 2070 (if present). If sufficient voltage is applied, breakdown will occur across the high-resistivity zone. In this state the material will become very conductive, with large populations of mobile carriers. The material will therefore pass current, and current crowding can occur near the top of the pillar 2050. The voltage which initiates this conduction is referred to as the "snapback" voltage, and FIG. 2C shows why.

FIG. 2C shows an example of instantaneous I-V curves for a device like that of FIG. 2A, in two different states. Three zones of operation are marked.

In the zone 2200 marked "READ," the device will act either as a resistor or as an open (perhaps with some leakage). A small applied voltage will result in a state-dependent difference in current, which can be detected.

However, the curve with open circles, corresponding to the amorphous state of the device, shows some more complex behaviors. The two curves show behaviors under conditions of higher voltage and higher current.

If the voltage reaches the threshold voltage $V_{th}$, current increases dramatically without any increase in voltage. (This occurs when breakdown occurs, so the phase-change material suddenly has a large population of mobile carriers.) Further increases in applied voltage above $V_{th}$ result in further increases in current; note that this upper branch of the curve with hollow circles shows a lower resistance than the curve with solid squares.

If the applied voltage is stepped up to reach the zone 2150, the behavior of the cell is now independent of its previous state.

When relatively large currents are applied, localized heating will occur at the top of the pillar 2050, due to the relatively high current density. Current densities with typical dimensions can be in the range of tens of millions of Amperes per square cm. This is enough to produce significant localized heating within the phase-change material.

This localized heating is used to change the state of the phase-change material, as shown in FIG. 2B. If maximum current is applied in a very brief pulse 2100 and then abruptly stopped, the material will tend to quench into an amorphous high-resistivity condition; if the phase-change material is cooled more gradually and/or not heated as high as zone 2150, the material can recrystallize into a low-resistivity condition. Conversion to the high-resistance state is normally referred to as "Reset", and conversion to the low-resistance state is normally referred to as "Set" (operation 2080). Note that, in this example, the Set pulse has a tail where current is reduced fairly gradually, but the Reset pulse does not. The duration of the Set pulse is also much longer than that of the Reset pulse, e.g. tens of microseconds versus hundreds of nanoseconds.

FIG. 2D shows an example of temperature versus resistivity for various PCM materials. It can be seen that each curve has a notable resistivity drop 2210 at some particular temperature. These resistivity drops correspond to phase change to a crystalline (or polysilicon) state. If the material is cooled gradually, it remains in the low resistivity state after cooling.

In a single-bit PCM, as described above, only two phases are distinguished: either the cell does or does not have a significant high-resistivity "mushroom cap" 2070. However, it is also possible to distinguish between different states of the mushroom cap 2070, and thereby store more than one bit per cell.

FIG. 2E shows an equivalent circuit for an "upside down" PCM cell 2010. In this example the pass transistor 2240 is gated by Wordline 2230, and is connected between the phase-change material 2250 and the bitline 2220. (Instead, it is somewhat preferable to connect this transistor between ground and the phase-change material.

FIG. 2F shows another example of a PCM cell 2010. A bitline 2220 is connected to the top electrode 2020 of the phase-change material 2250, and transistor 2240 which is connected to the bottom electrode 2030 of the PCM element. (The wordline 2230 which gates the vertical transistor 2240 is not shown in this drawing.) Lines 2232, which are shown as separate (and would be in a diode array), may instead be a continuous sheet, and provide the ground connection.

FIG. 2G shows an example of how resistance (R) changes over long time periods (t) for a single PCM cell following a single PCM write event at time t=0. The resistance curve 2400 for a cell which has been reset (i.e. which is in its high-resistance state) may rise at first, but then drifts significantly lower. The resistance curve 2410 for a cell in the Set state is much flatter. The sense margin 2420, i.e., the difference between set and reset resistances, also decreases over time. Larger sense margins generally result in more reliable reads, and a sense margin which is too small may not permit reliable reading at all. 2G represents the approximate behavior of one known PCM material; other PCM material compositions may behave differently. For example, other PCM material compositions may display variation of the set resistance over time.

The downwards drift of reset resistance may be due to, for example, shrinking size of the amorphous zone of the phase-change material, due to crystal growth; and, in some cells, spontaneous nucleation steepening the drift curve (possibly only slightly) due to introducing further conductive elements into the mushroom-shaped programmable region.

FIG. 2H shows an example of a processing system 2300. Typically, a processing system 2300 will incorporate at least some of interconnected power supplies 2310, processor units 2320 performing processing functions, memory units 2330 supplying stored data and instructions, and I/O units 2340 controlling communications internally and with external devices 2350.

FIG. 2I shows an example of a PCM single ended sensing memory. Two different PCM cells 2400 on different ends of a sense amplifier can be selected separately. Selected elements 2410 are separately sensed by a single-ended sense amplifier 2420.

FIG. 2J shows an example of a known PCM single ended sense amplifier 2500. Generally, in a single ended sense amplifier, a cell read output conducted by a selected bitline BLB is compared against a reference current to provide a digital output OUT. When the PRECHARGE signal turns on transistor 2530, voltage V04 (e.g., 400 mV) precharges the bitline BLB. After precharge ends, the READ signal turns on transistor 2550. Transistor 2550 is connected, through source follower 2560 and load 2580, to provide a voltage which comparator 2600 compares to Voltage_REF, to thereby generate the digital output OUT.

A variety of nonvolatile memory technologies have been proposed over recent decades, and many of them have required some engineering to provide reference values for sensing. However, the requirements and constraints of phase-change memory are fundamentally different from those of any other kind of nonvolatile memory. Many memory technologies (such as EEPROM, EPROM, MNOS, and flash) test the threshold voltage of the transistor in a selected cell, so referencing must allow for the transistor's behavior. By contrast, phase-change memory simply senses the resistance of the selected cell. This avoids the complexities of providing a reference which will distinguish two (or more) possibilities for an active device's state, but does require detecting a resistance value, and tracking external variations (e.g. temperature and supply voltage) which may affect the instantaneous value of that resistance.

The possibility of storing more than one bit of data in a single phase-change material has also been suggested. Phase-change memories implementing such architectures are referred to here as "multibit" PCMs. If the "Set" and/or "Reset" operations can be controlled to produce multiple electrically distinguishable states, then more than one bit of information can be stored in each phase-change material location. It is known that the current over time profile of the Set operation can be controlled to produce electrically distinguishable results, though this can be due to more than one effect. In the simplest implementation, shorter anneals—too short to produce full annealing of the amorphous layer—can be used to produce one or more intermediate states. In some materials, different crystalline phases can also be produced by appropriate selection of the current over time profile. However, what is important for the present application is merely that electrically distinguishable states can be produced.

For example, if the complete layer of phase-change material can have four possible I/V characteristics, two bits of information can be stored in each cell—IF the read cycle can accurately distinguish among the four different states.

(The I/V characteristics of the cells which are not in the fully Set state are typically nonlinear, so it is more accurate to distinguish the states in terms of current flow at a given voltage; resistance is often used as a shorthand term, but implies a linearity which may not be present. The cells can be highly nonlinear, and usually operate similarly to a punch-through diode.)

In order to make use of the possible multibit cell structures, it is necessary to reliably distinguish among the possible states. To make this distinction reliably, there must be some margin of safety, despite the change in characteristics which may occur due to history, manufacturing tolerances, and environmental factors. Thus the read architecture of multibit PCMs is a far more difficult challenge it is for PCMs with single-bit cells.

SUMMARY

The present application relates to phase-change memories, and more particularly to write optimization in phase-change memories.

The present inventors have realized that write speed in phase change memory can be optimized chunk-by-chunk if data can be transformed on the fly. Data can e.g. be written directly or as a transformation on a word-by-word basis, with one or more extra selection bit(s) to indicate transformation state.

The present innovations are uniquely applicable to phase change memory, due in part to programming differences between a SET and a RESET operation. RESET operations are often preferable to SET operations, as they are faster and lower-power. Both RESET and SET operations are usually preferable to intermediate-level operations (in multi-level implementations). However, these relative preferences will sometimes depend in part on the initial contents of the cells being written.

The disclosed innovations, in various embodiments, provide one or more of at least the following advantages. However, not all of these advantages result from every one of the innovations disclosed, and this list of advantages does not limit the various claimed inventions.

Faster writes;
Decreased power consumption; and
Optimizing for speed, power, speed or power (selectably), available time for writing, balancing cell wearout.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present inventors have realized that write speed can be optimized chunk-by-chunk if data can be transformed on the fly. Data can e.g. be written directly or as a transformation on a word-by-word basis, with one or more extra selection bit(s) to indicate transformation state. RESET operations can be preferable to SET operations, and both can be preferable to intermediate-level operations (in multilevel implementations).

Due in part to the unique physical and electrical properties of phase change memories, SET and RESET states are not merely equivalent to a logical "0" and logical "1". The correspondence between the physical and logical states is fixed within a given architecture, but can and does differ between architectures. The present innovative techniques are driven primarily by the physical states in phase change memory and the unique properties thereof, rather than by the logical equivalents of the physical states.

The present innovations are uniquely applicable to phase change memory, due in part to programming differences between a SET and a RESET operation. RESET operations are often preferable to SET operations, as they are faster and lower-power. Both RESET and SET operations are usually preferable to intermediate-level operations (in multi-level implementations). However, these relative preferences will sometimes depend in part on the initial contents of the cells being written.

In one sample single-bit embodiment, the number of SET operations required is compared to the number of RESET operations required to write a data word. If more RESETs are required than SETs, the data word can be written as-is, without transformation, and a selection symbol (consisting of e.g. a single PCM cell) can be written, e.g. with a SET operation, to indicate non-transformation. If more SET operations than RESET operations are required for the data word, the data word can be written with SET and RESET operations exchanged, and a selection symbol can be written, e.g. in a RESET state, to indicate transformation.

Figure 1A:
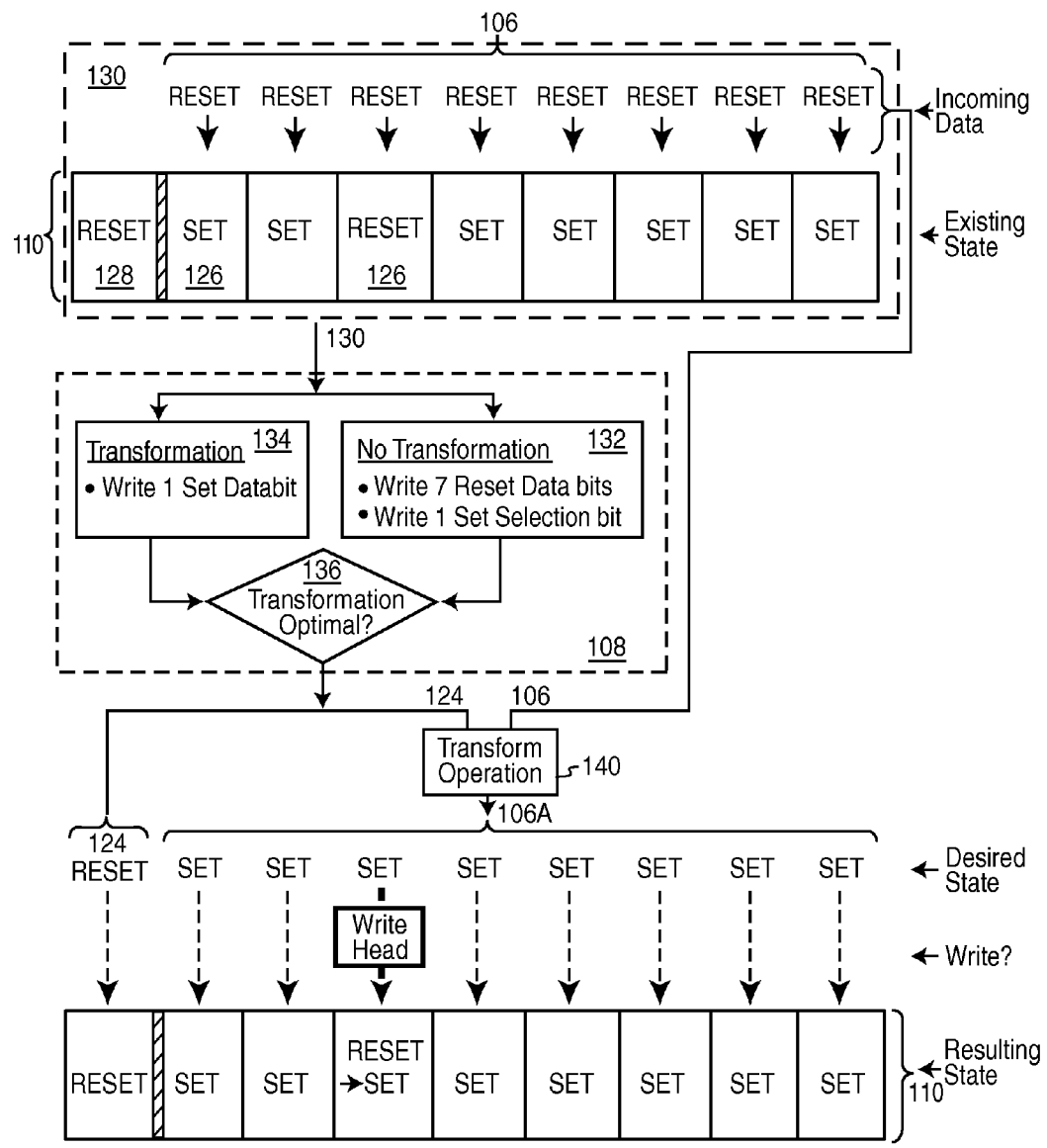
FIGS. 1A and 1B show write process flows for one sample embodiment of the present innovations.
Figure 1B:
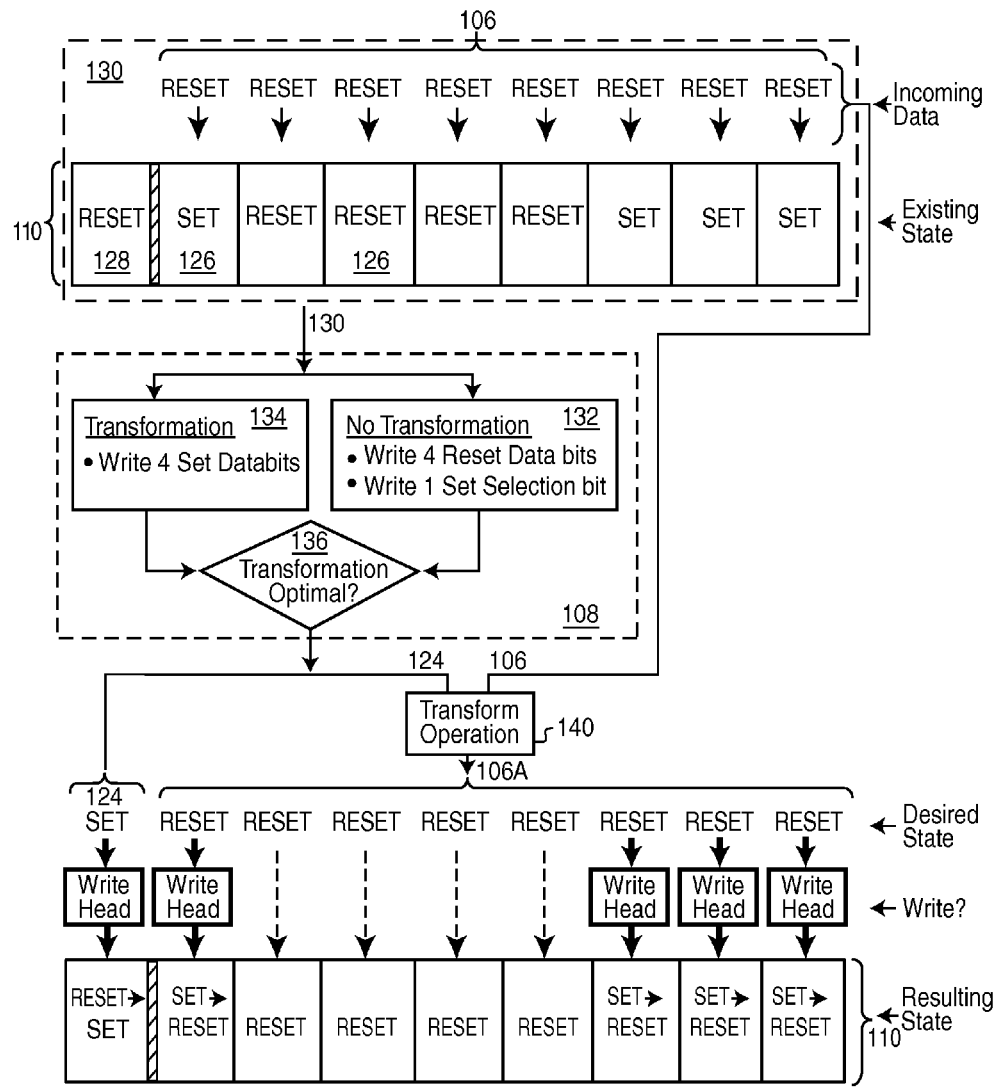
Figure 2A:
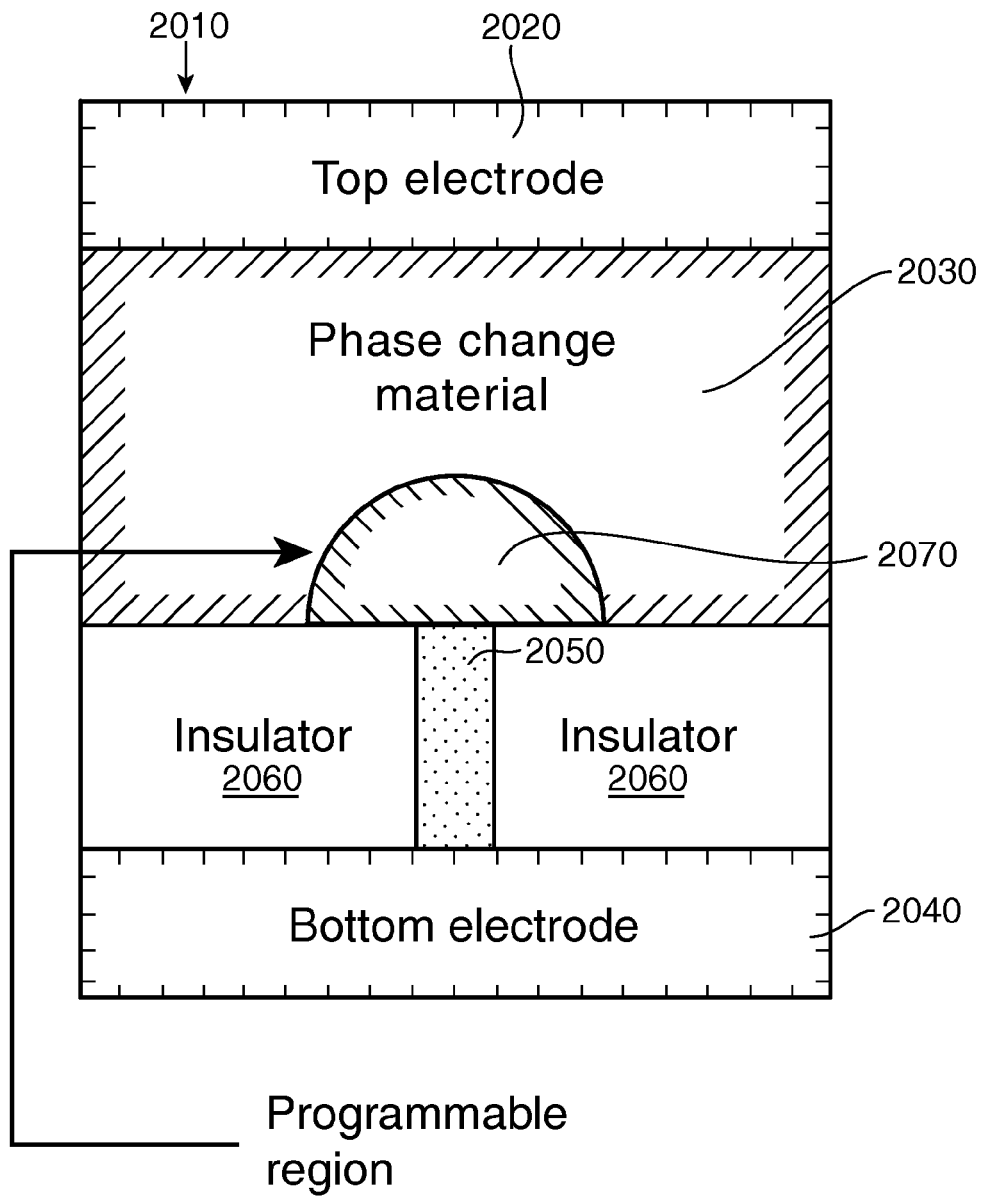
FIG. 2A shows an example of a PCM element.
Figure 2B:
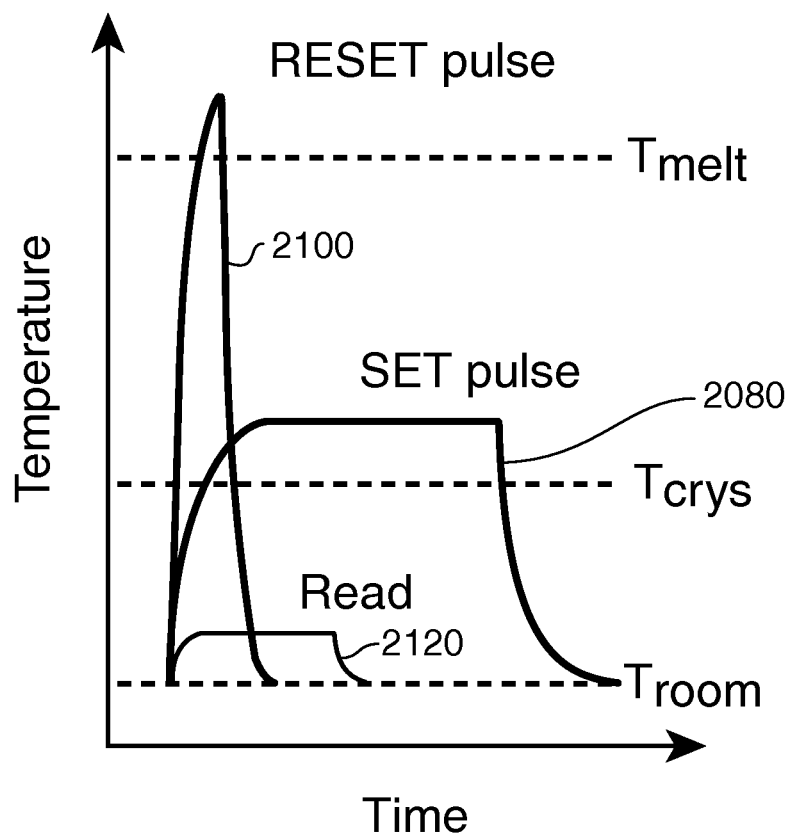
FIG. 2B shows an example of PCM bit line signals.
Figure 2C:
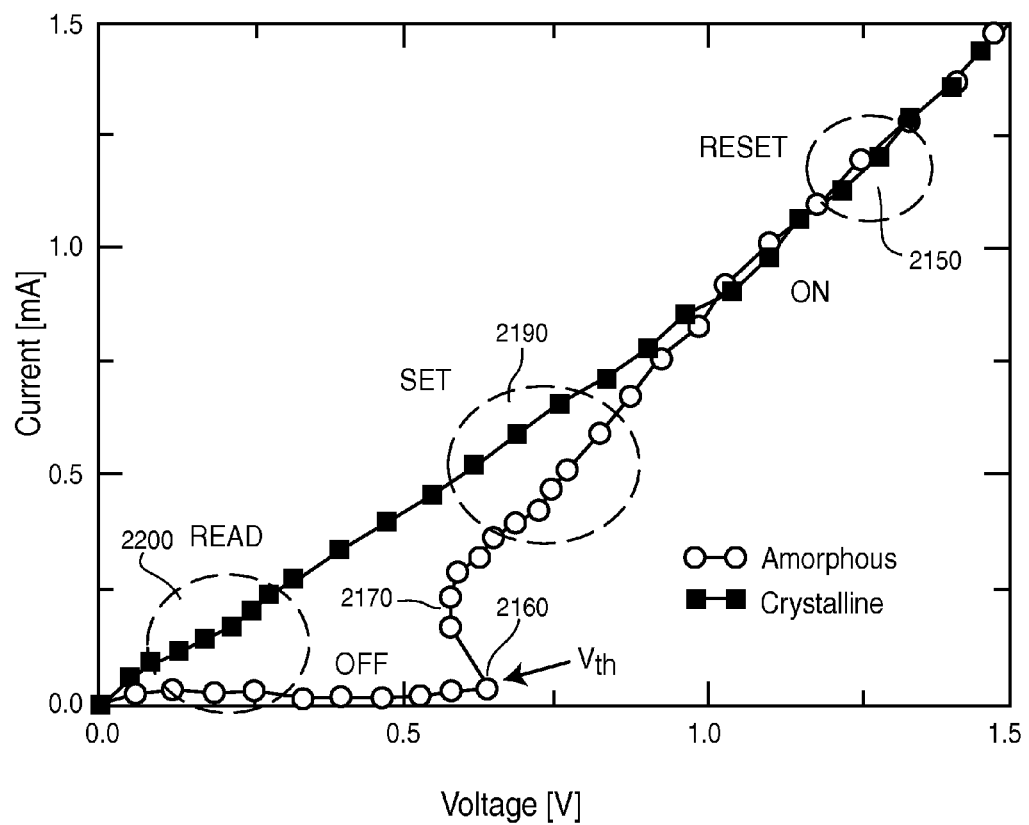
FIG. 2C shows an example of voltage versus current in a PCM material.
Figure 2D:
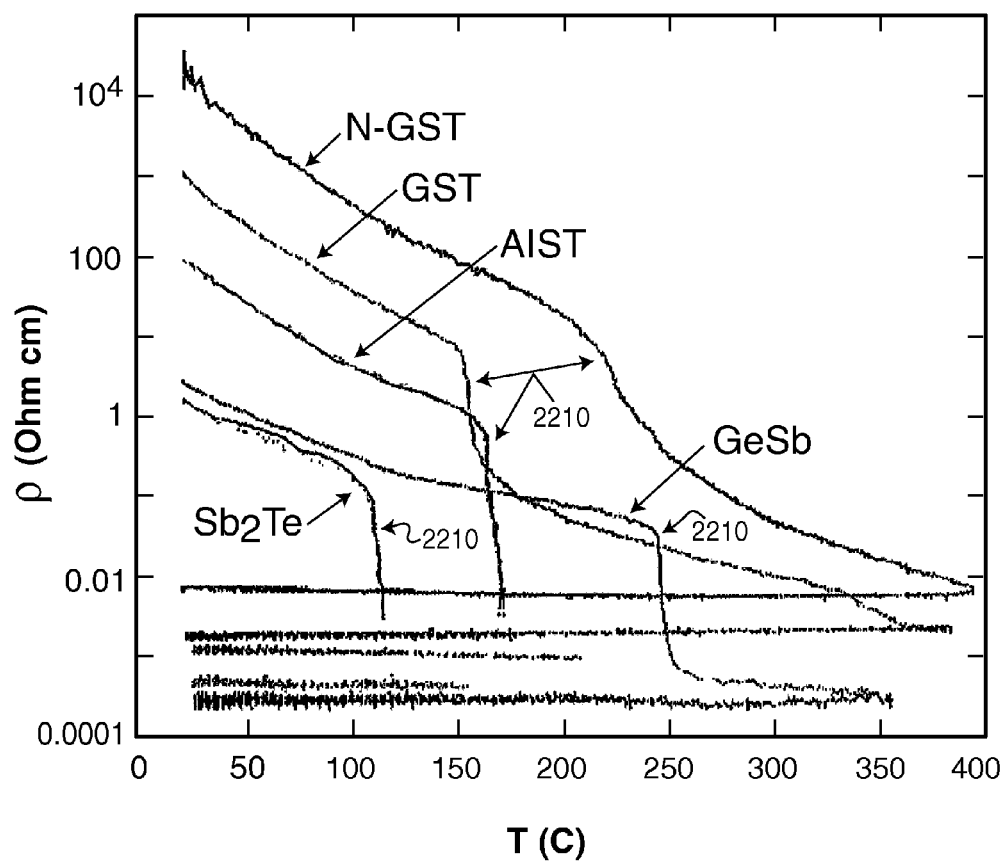
FIG. 2D shows an example of temperature versus resistance in a PCM material.
Figure 2E:
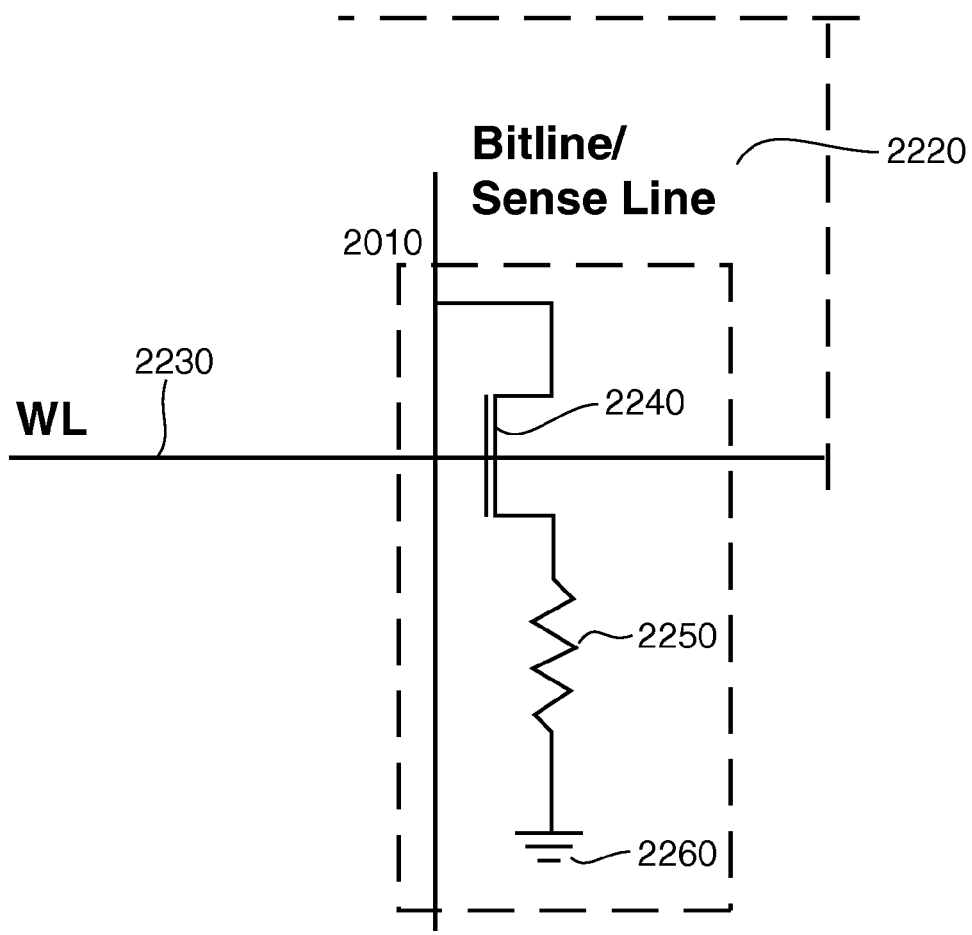
FIG. 2E shows an example of a PCM cell.
Figure 2F:
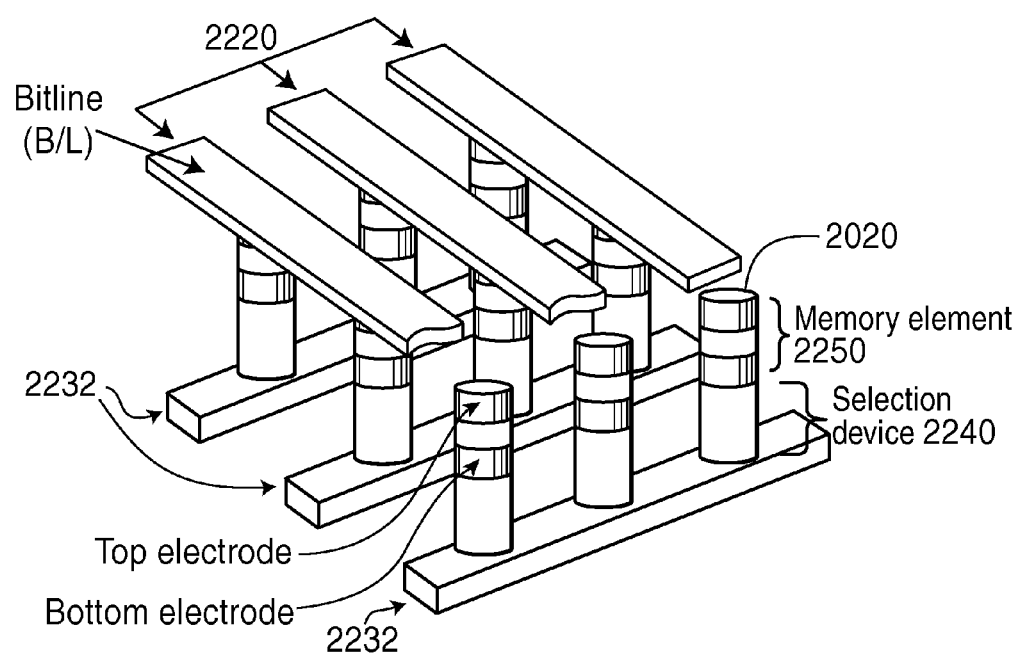
FIG. 2F shows an example of a PCM cell.
Figure 2G:
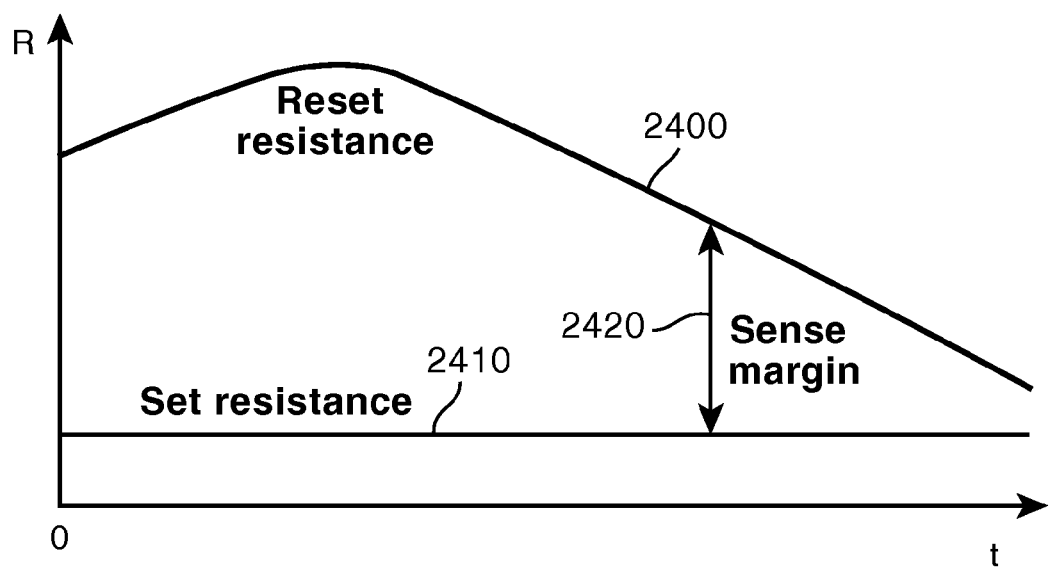
FIG. 2G shows an example of resistance over time for a PCM cell.
Figure 2H:
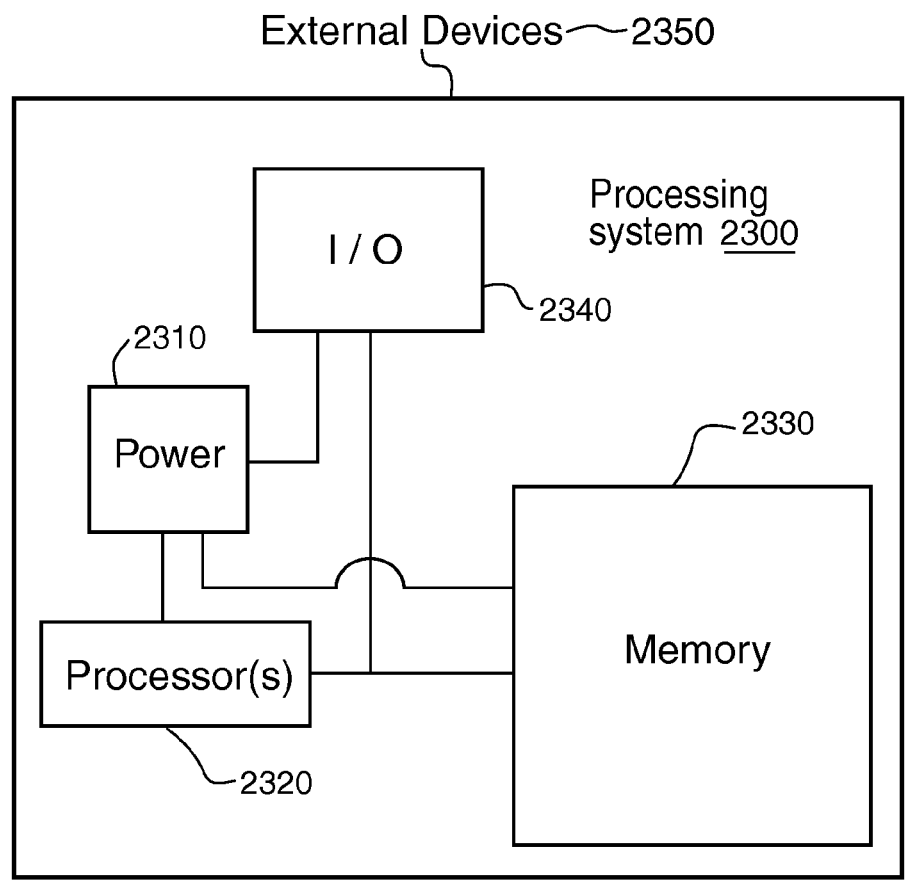
FIG. 2H shows an example of a processing system.
Figure 2I:
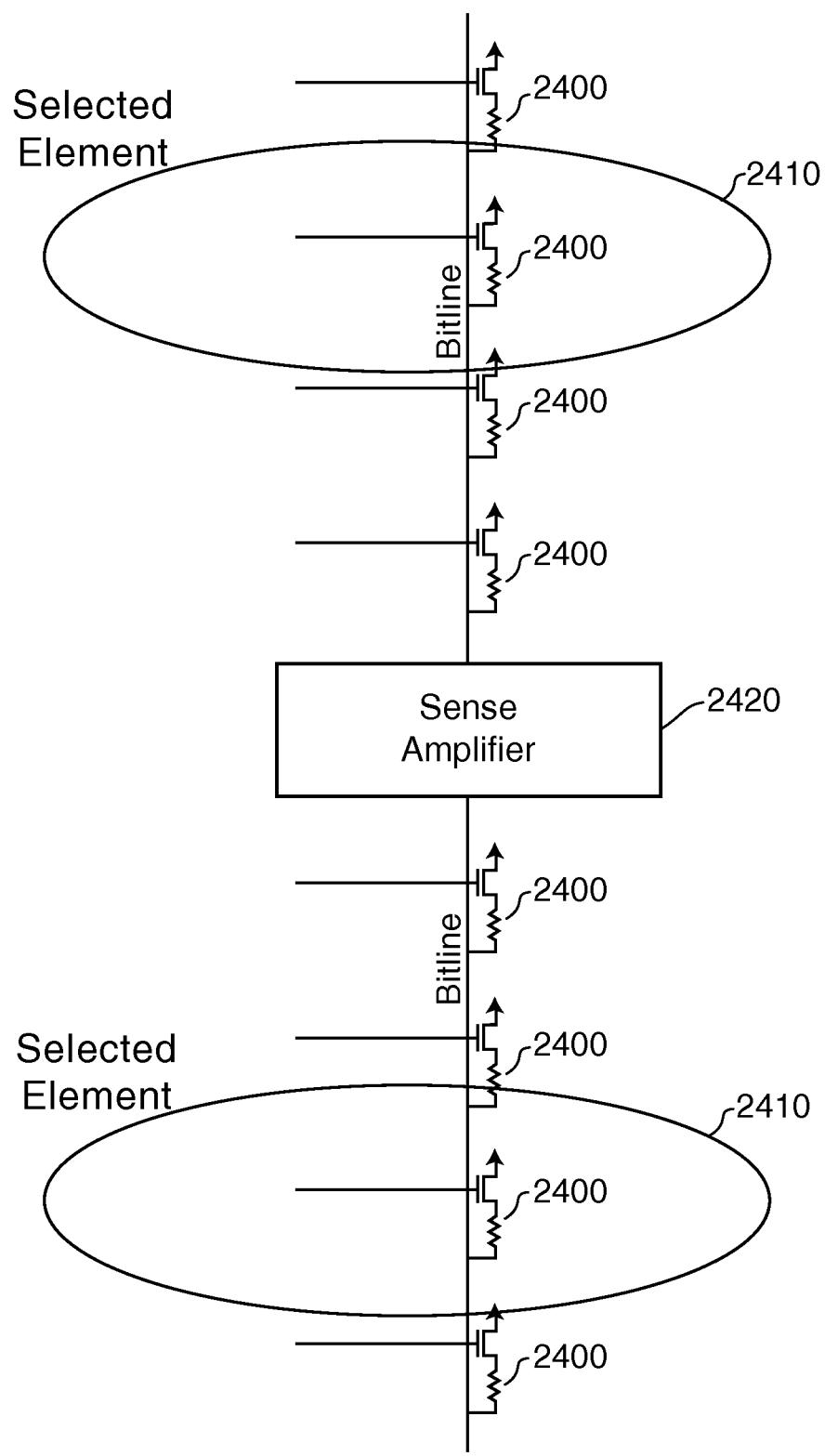
FIG. 2I shows an example of a PCM single ended sensing memory.
Figure 2J:
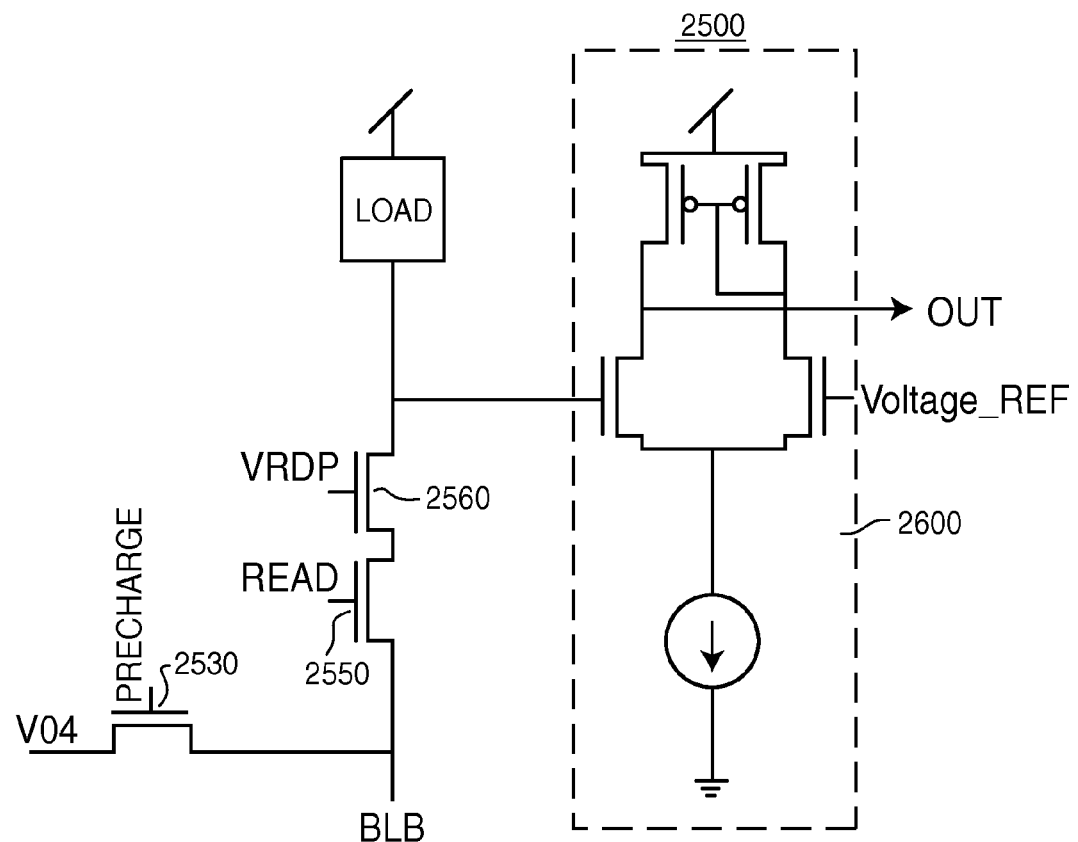
FIG. 2J shows an example of a known PCM single ended sense amplifier.

In the sample embodiments of FIGS. 1A and 1B, data chunk 106, comprising eight RESET operations, is to be written to PCM cell block 110. PCM cell block 110 comprises eight data cells 126 and one selection cell 128. In FIG. 1A, all but one of data cells 126 are in a SET state, while selection cell 128 is in a RESET state. (In the present example, a selection cell in a RESET state indicates transformation, and a selection cell in a SET state indicates non-transformation.)

Information on write state 130 is then passed to transformation test 108. This information includes the desired state represented by data chunk 106, as well as the initial state of PCM cells 110. Transformation test 108 determines that non-transforming write operation 132 requires seven RESET operations (to data cells 126) and one SET operation (to selection cell 128), while transforming write operation 134 requires one SET operation (to a data cell 126) and zero RESET operations. Decision stage 136 then determines that, in this sample embodiment, transforming write 134 provides greater writing efficiency than does non-transforming write 132. While non-transforming write 132 requires a much lower ratio of SET operations to RESET operations than transforming write 134 (which has an infinitely higher ratio), transforming write 132 is still more desirable. While both non-transforming write 132 and transforming write 134 require one SET operation, non-transforming write 132 also requires a further seven RESET operations. Thus, transforming write 134 will be desirable over non-transforming write 132 in most such embodiments.

Decision stage 136 returns selection symbol 124. Transform operation 140 then uses selection symbol 124 to transform data chunk 106, to produce modified data chunk 106A. In the present example, selection symbol 124 is a RESET operation to indicate transformation. In one single-bit sample embodiment, transform operation 140 can be e.g. an XNOR operation, where the result of the operation XNOR(SET, RESET) is defined to be RESET.

Modified data chunk 106A and selection symbol 124 are then compared once more against PCM cells 110. In the present example, only one write operation differs from the state of its respective PCM cell 110. This information is passed to a write head, and only one write operation, taking a RESET-state cell to a SET-state, is written to cells 110.

In the present sample embodiment, no selection-symbol operation (such as e.g. selection symbol 124) is present with incoming data chunk 106. As data chunk 106 will usually not come in with an appropriate number of cells allocated to a selection symbol, a selection symbol is shown here as being added to the write operation only after transformation test 108.

In FIG. 1B, four of phase change memory cells 110, and specifically four of data cells 126, are in a RESET state, rather than the single RESET-state cell in FIG. 1A. Here, the transformation decision returns a different result. If the incoming data is transformed, four SET operations will be required, all to data cells. If the incoming data is not transformed, four RESET operations (to data cells) will be required, and one SET operation (to a selection cell) will be required. Transformation stage 108 returns the result that no transformation is performed. Information on the cells to be written is passed to a write head (or write heads), which writes untransformed data 106A to phase change memory cells 110.

In a multi-level sample embodiment (where 'multi-level' and 'multi-bit' are used synonymously), a selection symbol can be used e.g. to indicate the transformation used to write the data word.

Figure 3:
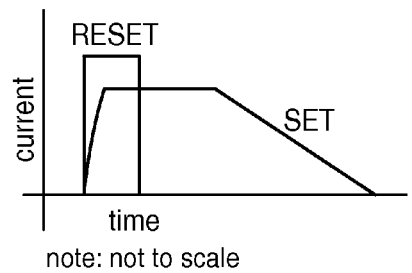
FIG. 3 shows SET and RESET current profiles for one sample embodiment of the present inventions.

FIG. 3 shows sample SET and RESET current profiles for one sample embodiment, in which the increased power consumption of a SET operation over a RESET operation can be seen.

Figure 4:
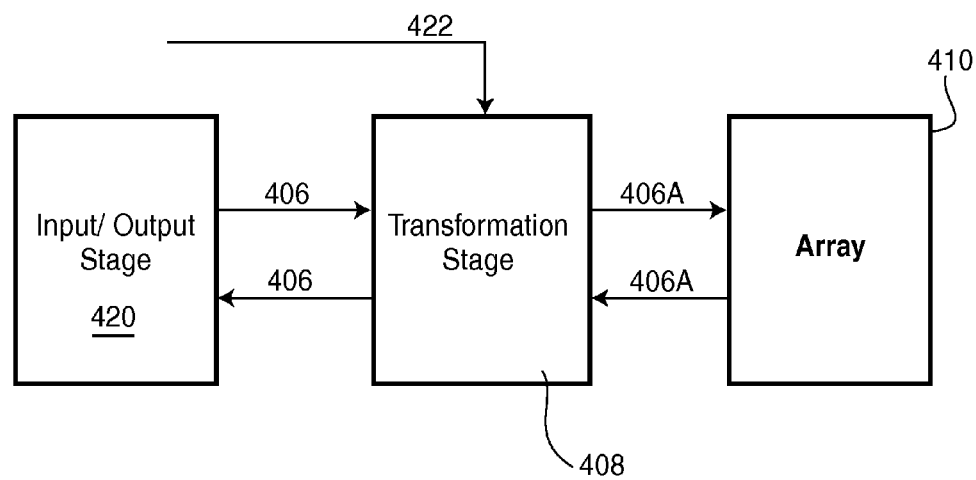
FIG. 4 schematically shows a process flow for one sample embodiment of the present inventions.

In FIG. 4, data 406 is to be written from input/output stage 420 to some portion of array 410. Data 406 is transformed by transformation stage 408, in view of transformation element 422, into data transformation 406A. Data transformation 406A is then written to array 410. When data 406 is to be read to input/output stage 420, data transformation 406A is read from array 410 to transformation stage 408. Transformation stage 408 applies an inverse transformation to data transformation 406A, in view of transformation element 422, to retrieve data 406, which is then returned to input/output stage 420.

In some sample embodiments, data transformation 406A can include a transformation symbol. This transformation symbol, if present, can indicate the method used to transform data 406 into data transformation 406A. The transformation symbol can be used by transformation stage 408 in retrieving data 406 from data transformation 406A, and can in some implementations encode transformation element 422.

In one sample embodiment, transformation element 422 can indicate that each chunk of data 406 is to be transformed or not based on the frequency of the data levels in that data chunk. In another sample embodiment, transformation element 422 (and thus the transformation or non-transformation state of the data) can be fixed for a given segment of data, or for all of array 410, or even for the entire chip. In another sample embodiment, transformation element 422 can dynamically indicate the transformation method used, or the subset of possible transformations that are being considered for the data chunk in question.

Figure 5A:
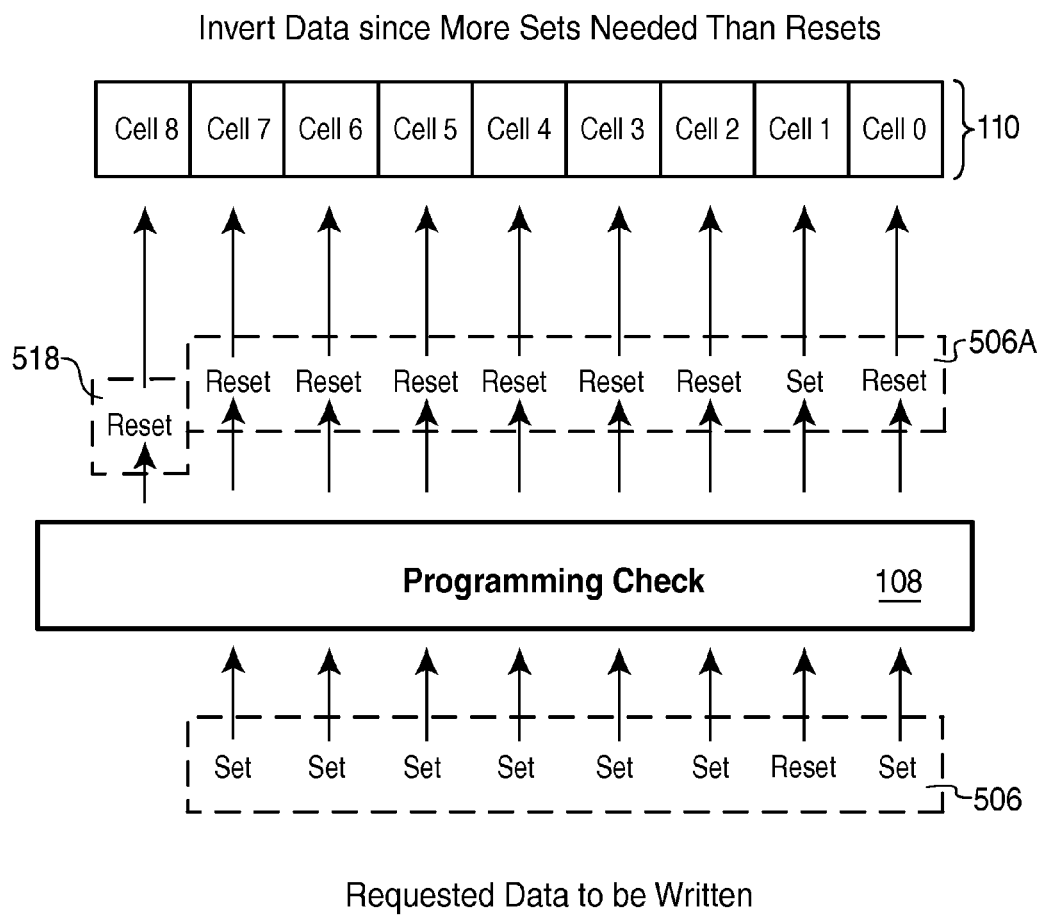
FIGS. 5A and 5B show two sample data chunk transformations for one sample embodiment of the present inventions.

In FIG. 5A, data chunk 506 consists of more SET operations than it does RESET operations. Programming check 108 analyzes data chunk 506 and determines that data chunk 506 can be more efficiently written by transforming data chunk 506 into transformed data chunk 506A, which is then written to PCM cells 110. Transformed data chunk 506A is obtained by transforming SET operations into RESET operations, and vice versa. Selection symbol 518 is written with a RESET operation to indicate that this transformation has occurred.

Figure 5B:
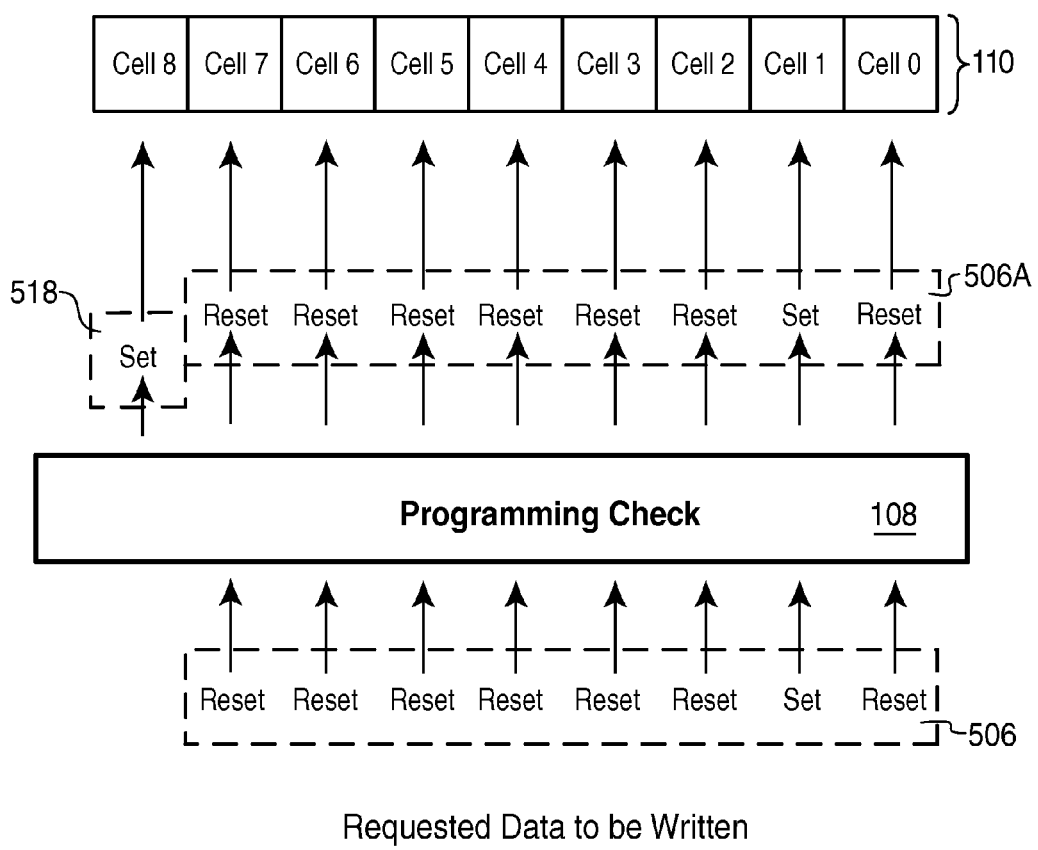

FIG. 5B shows a parallel situation to that of FIG. 5A. Here, data chunk 506 is composed of more RESET operations than SET operations. Programming check 108 determines that data chunk 506 is best written to PCM cells 110 as data 506A without transformation (or e.g. with an identity transformation). SET operations are written as SET operations, and RESET operations are written as RESET operations. Selection symbol 518 is written as a SET operation to indicate, in this sample embodiment, that no transformation is performed.

FIGS. 5A and 5B can be following different transformation optimization rules than, e.g., FIGS. 1A and 1B. In FIGS. 5A and 5B, the transformation test can be, e.g., simply whether more SET or more RESET operations are required.

Figure 6A:
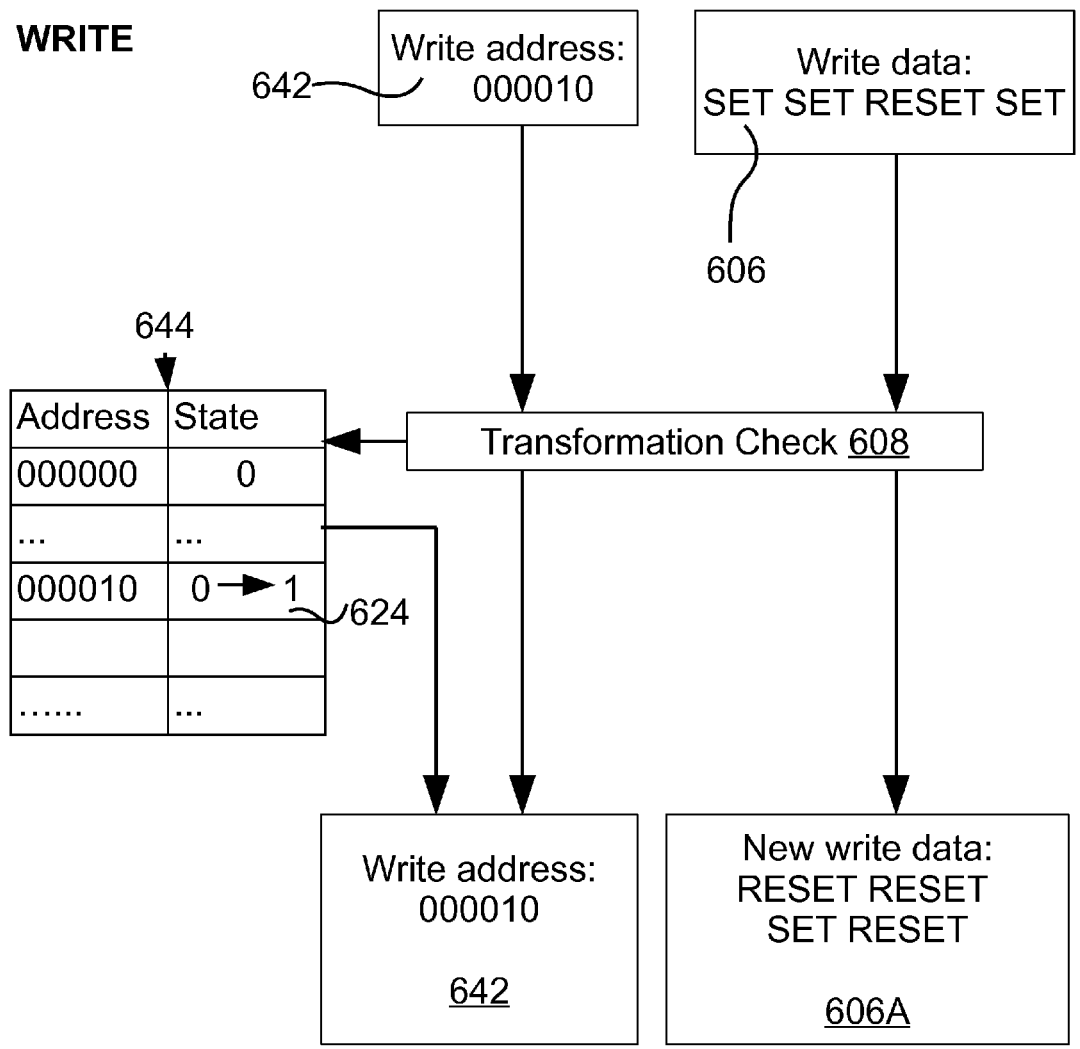
FIGS. 6A and 6B show sample read and write operations for another sample embodiment of the present inventions.
Figure 6B:
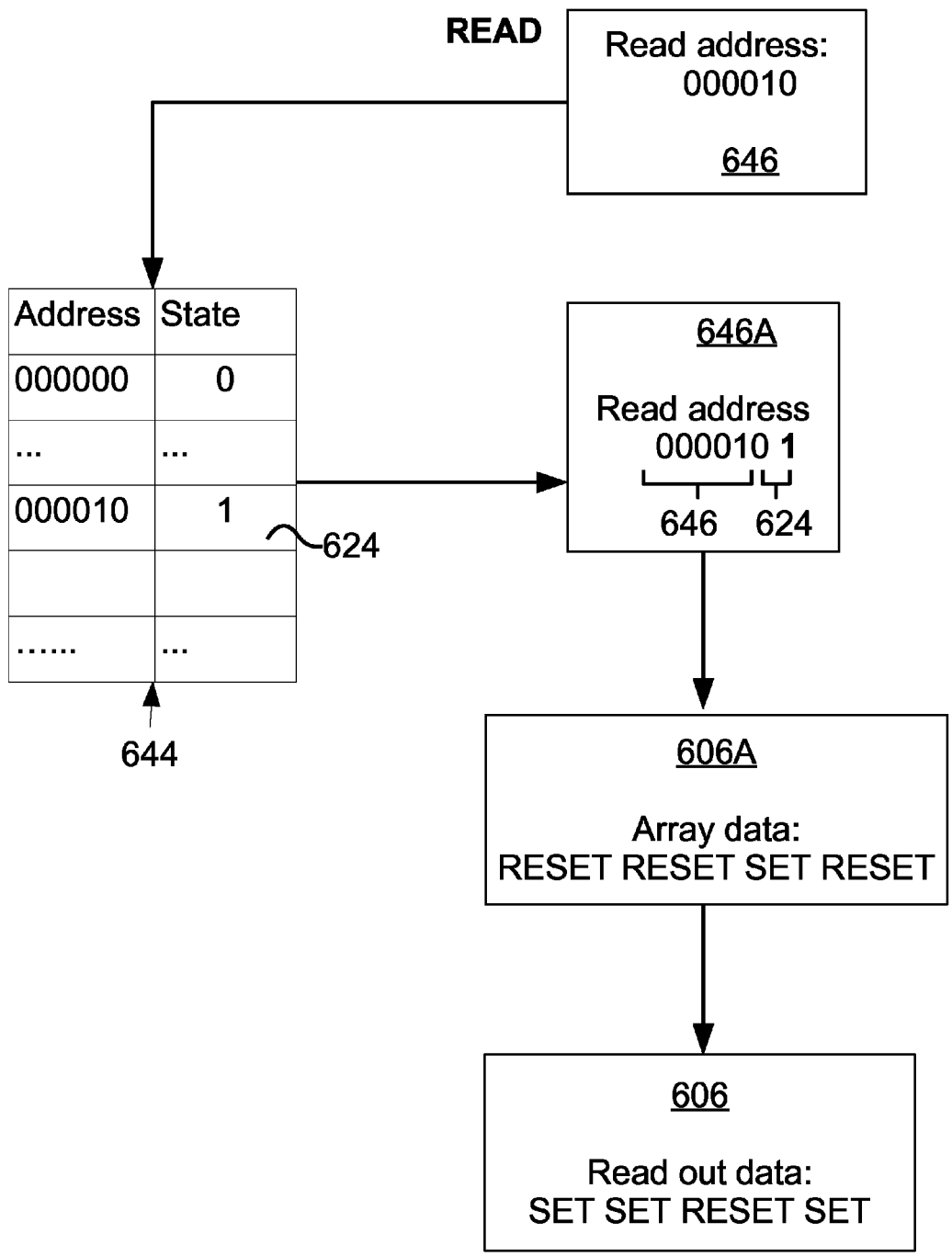

In some sample embodiments, such as those of FIGS. 6A and 6B, the cell or cells indicating the transformation state of a data word is not contiguous with the data word, but can be e.g. coincident with the address of the word. In FIG. 6A, data chunk 606 is to be written at write address 642. Transformation check 608 determines that data chunk 606 should be transformed into transformed data chunk 606A by inverting SET and RESET states. Transformation check 608 then looks up write address 642 in lookup table 644. Selection symbol 624, in the row of lookup table 644 corresponding to write address 642, is written as a 1, indicating SET-RESET transformation. Write address 642 and modified data chunk 606A are then passed e.g. to a write head.

FIG. 6B shows a sample read operation which can be complementary to the write operation of FIG. 6A. Lookup table 644 finds the row corresponding to read address 646, and retrieves corresponding selection symbol 624. Corresponding selection symbol 624 is then (in this sample embodiment) appended to read address 646, yielding modified read address 646A. When data chunk 606A is read from the location corresponding to read address 646A, it can immediately be translated into original data chunk 606, using selection symbol 624 at the end of modified read address 646A.

Figures 7A, 7B:
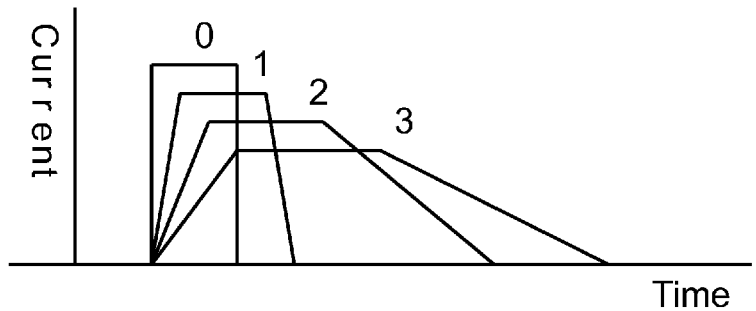
FIG. 7A shows pulse current profiles for one four-level sample embodiment.
FIG. 7B shows a state transformation table according to one sample embodiment of the present inventions.

FIG. 7A shows a plot of current vs. time for one four-state sample embodiment. States 0 and 3 can be considered as equivalents of RESET and SET, respectively, while states 1 and 2 are two intermediate states. FIG. 7B shows the 24 transformations possible in a 4-state embodiment. In this sample embodiment, a selection symbol containing three PCM cells will be sufficient to encode any possible transformation, as seen in the row labeled "Multi-bit code". This row labeled "Multi-bit code" indexes the transformations in base-4 notation, e.g. as it can be written to four-level cells in one sample embodiment. In some implementations, this can be combined synergistically with the teachings of Ser. No. 13/869,338, which is hereby incorporated by reference.

Figure 8A:
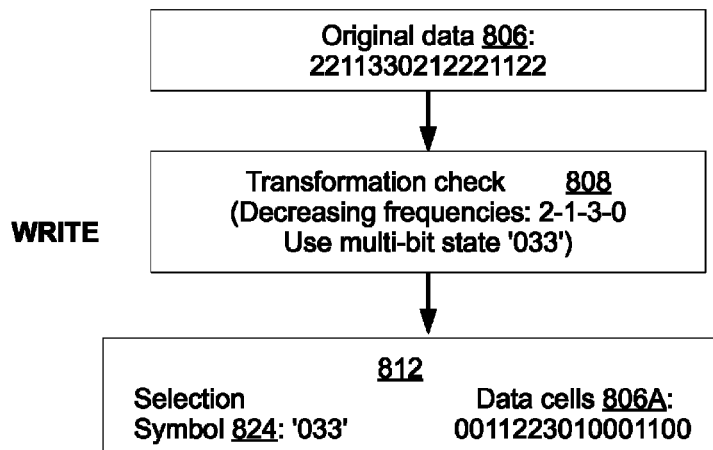
FIGS. 8A and 8B show sample read and write cycles for a multi-bit sample embodiment of the present inventions.

The sample embodiment of FIG. 8A demonstrates one possible way to use the transformation tables of FIG. 7B. In FIG. 8A, transformation check 808 determines that the operation frequencies of data chunk 806 are, in order of decreasing frequency, operations 2-1-3-0 (that is, operation 2 is most common, followed by operation 1, then operation 3, then operation 0). In this sample embodiment, the transformed operations can be ranked so that the desired transformed write operations, in order of descending frequency, are ordered as 0-1-2-3. Thus, in this sample embodiment, the transformation state is selected from the transformation tables of FIG. 7B to be decimal state '15', the multi-bit selection symbol of which is '033' (properly, '$033_4$'). In this sample embodiment, the transformation, expressed as 'initial operation-final operation', can be stated as '2→0, 1→1, 3→2, 0→2'. The associated transformation is applied to data chunk 806, resulting in final write information 812, comprising selection symbol 824 and transformed data 806A.

Figure 8B:
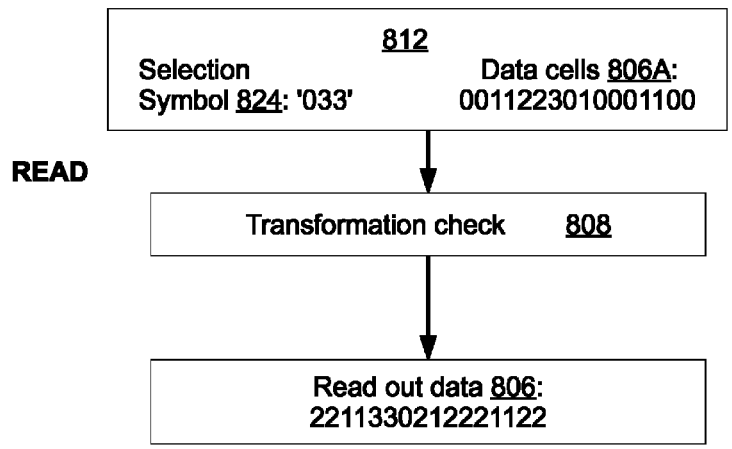

FIG. 8B shows a sample write operation, which can be e.g. complementary to the sample write operation of FIG. 8A. Information 812, comprising selection symbol 824 and transformed data 806A, is read from an array. In this sample embodiment, transformation check 808 can, e.g., look up selection symbol 824 in the transformation table of FIG. 7B to determine the transformation used to write transformed data 806A. Transformation check then applies the appropriate inverse transformation to read data 806A, and returns data 806.

Figure 9A:
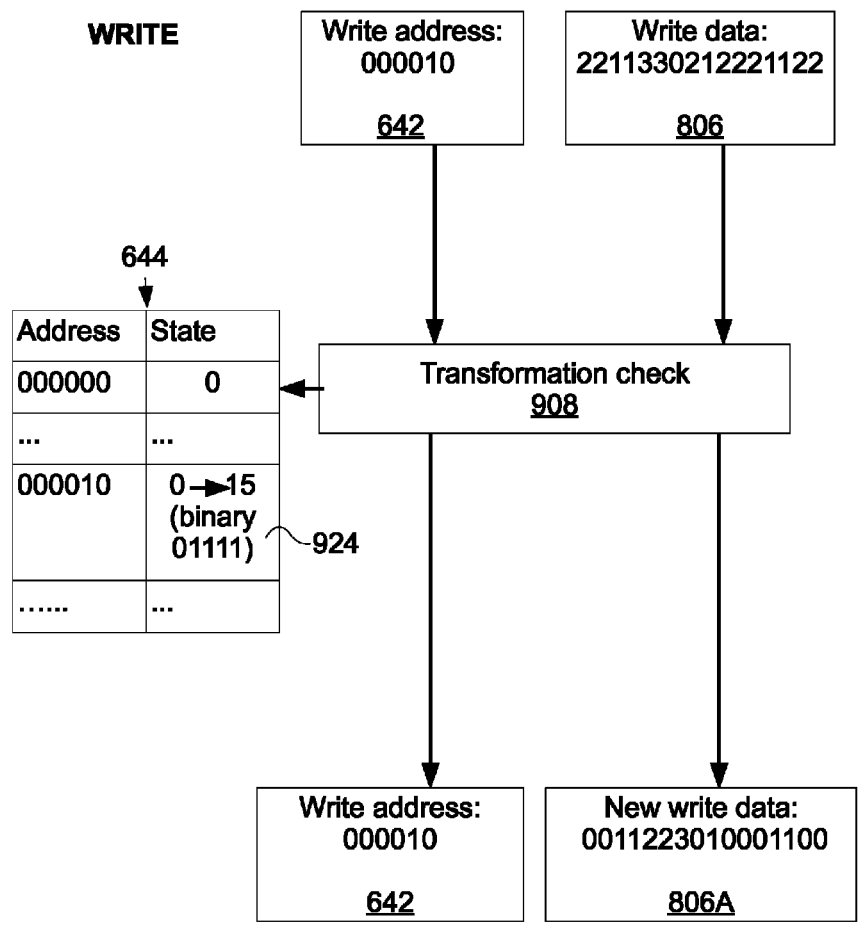
FIGS. 9A and 9B show sample read and write cycles for another multi-bit sample embodiment of the present inventions.

FIG. 9A shows a multi-bit sample write operation similar to that of FIG. 6A. Write address 642 and write data 806 are input to transformation check 908. Transformation check 908 analyzes write data 806 as in, e.g., FIG. 8A. In one sample embodiment, transformation check 908 determines that an appropriate transformation of write data 806 is transformation state '15' (decimal state '$15_{10}$', multi-bit state '$033_4$', binary '$01111_2$') from the transformation tables of FIG. 7B. Write address 642 is located in lookup table 644, and selection symbol 924, corresponding to write address 642, is written appropriately to reflect the chosen transformation. Transformation check 908 then applies the chosen transformation to write data 806, resulting in transformed write data 806A. Write address 642 and transformed data 806A are then, e.g., passed to a write head to be written to an array.

Figure 9B:
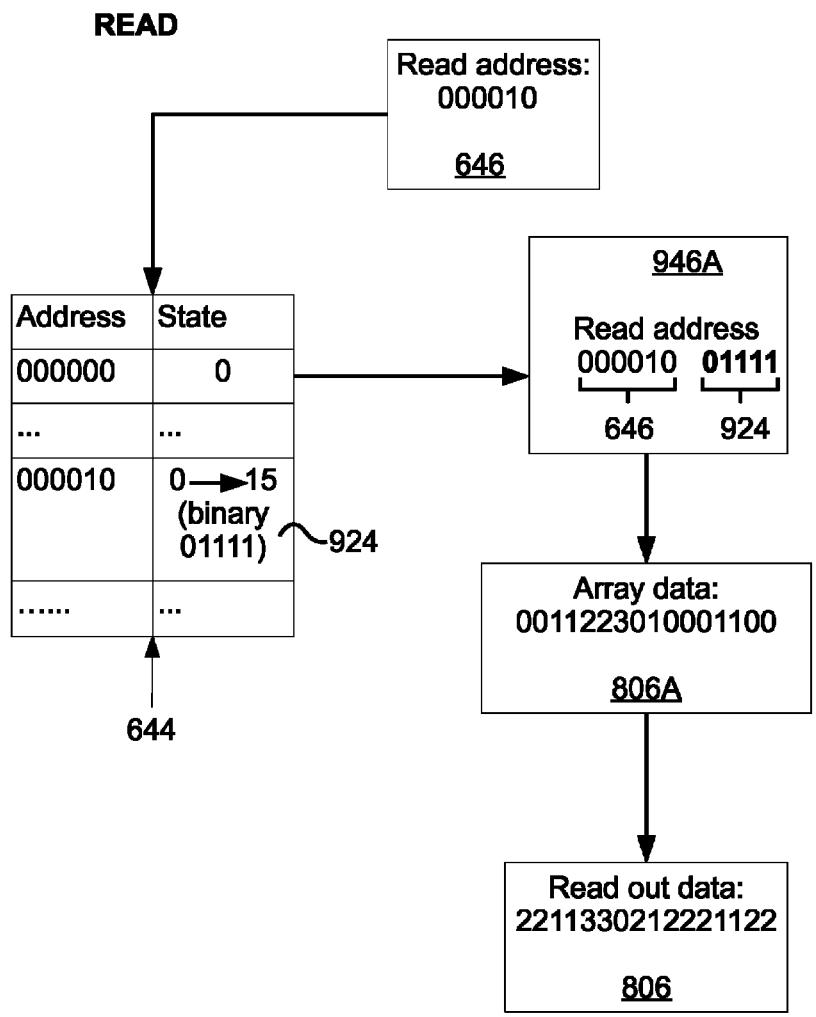

A sample read operation, which is, for example, complementary to the sample write operation of FIG. 9A, can be seen in FIG. 9B. Read address 646 is located in lookup table 644, and corresponding selection symbol 924 is retrieved. Modified read address 946A, consisting of read address 646 and selection symbol 924, is then passed to a read head, which locates and retrieves data 806A from read address 646. The inverse of the transformation indicated by selection symbol 924 is applied to array data 806A, yielding final read data 806.

In one sample embodiment, a transformation operation can be thought of as a simple hash function. Whereas conventional hashing tends to optimize for e.g. random distribution of data, the present inventions can be thought of as hash functions which optimize e.g. for minimal power in writing, or for other considerations such as e.g. energy, speed, etc. The transformation state of the desired data word can be retrieved with the address of that data word, rather than with the data word itself. As is generally true of a proper hash function, the transformations of the present innovations are fully reversible.

Figure 10A:
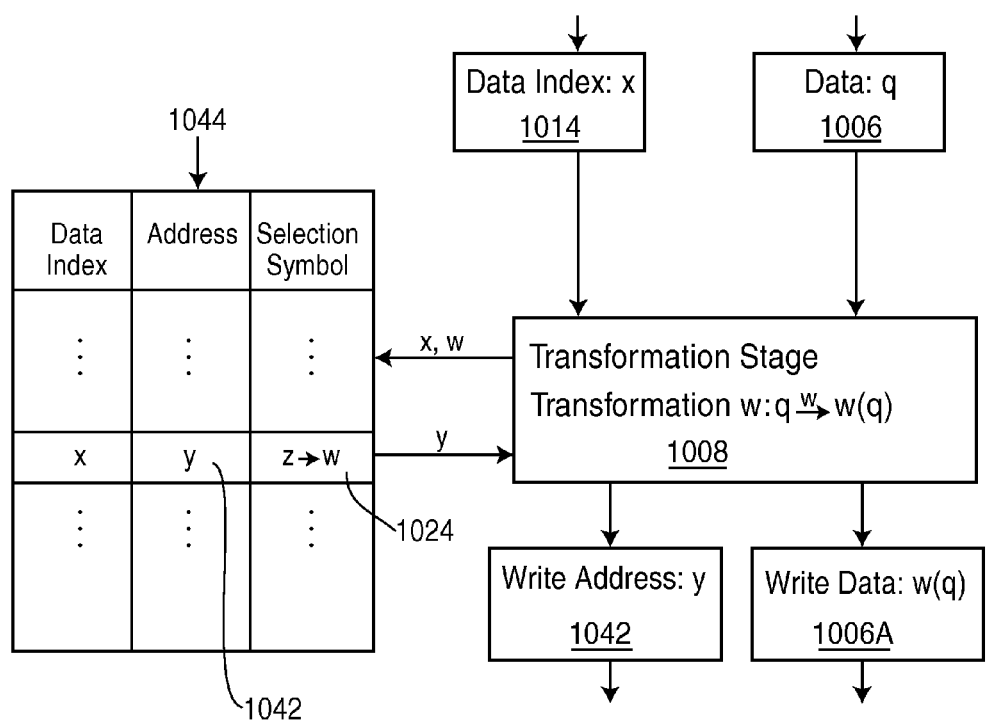
FIGS. 10A and 10B show sample read and write cycles for yet another multi-bit sample embodiment of the present inventions.

In the sample write operation of FIG. 10A, data index 1014 and data 1006 are passed together to transformation stage 1008. Data index 1014 identifies data 1006 in some fashion, and can be used to determine the array address to which data 1006 is to be written. In one sample embodiment, data index 1014 can be, e.g., a hash index of data 1006 into lookup table 1044. Transformation stage 1008 determines that data 1006 is best written using an optimal transformation indicated by selection symbol 1024. Transformation stage 1008 locates data index 1014 in lookup table 1044, retrieves corresponding write address 1042, and writes the corresponding selection symbol appropriately with selection symbol 1024. Transformation stage 1008 returns write address 1042 and write data 1006A. Write data 1006A can then be written to memory at write address 1042.

Figure 10B:
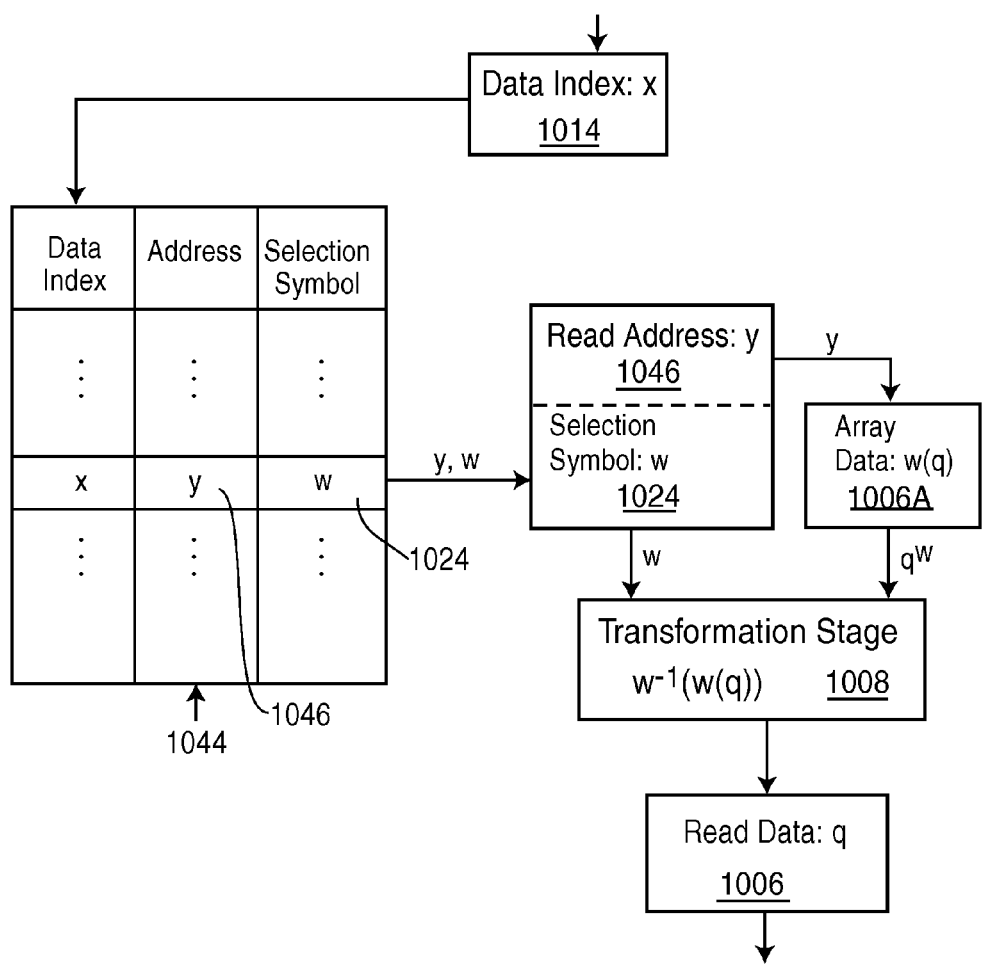

FIG. 10B shows a sample read operation complementary to, e.g., the sample write operation of FIG. 10A. Data index 1014 is used to retrieve read address 1046 and selection symbol 1024 from lookup table 1044. Read address 1046 is used to retrieve data 1006A from memory. Selection symbol 1024 and array data 1006A are then passed to transformation stage 1008. Transformation stage 1008 applies the inverse of the transformation indicated by selection symbol 1024 to array data 1006A, and returns read data 1006.

Figure 11:
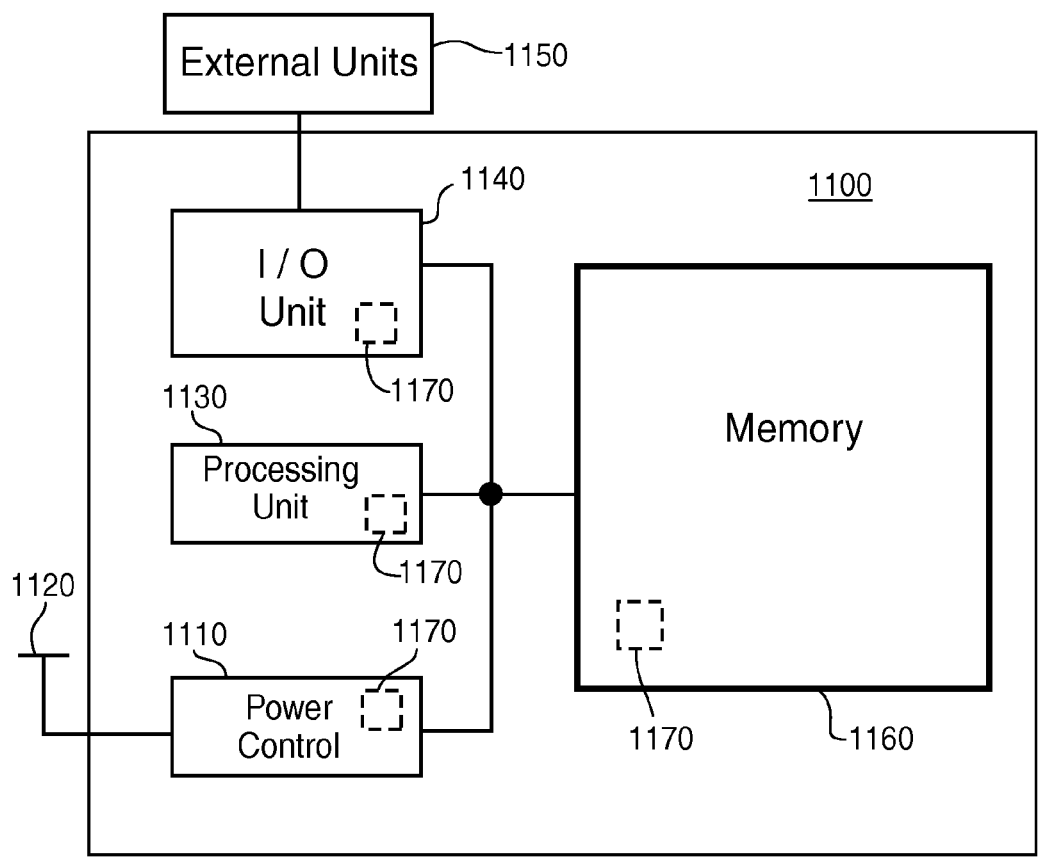
FIG. 11 shows a sample phase change memory system.

FIG. 11 shows an example of a processing system 1100. Power control 1110 manages distribution of power from a power source 1120 to other components of the processing system. A processing unit 1130 performs processing functions, and an I/O 1140 (input/output) unit operates and manages communications with, and enables other processing system components 1110, 1130, 1140, 1160 to operate and manage communications with, external units 1150. The power control 1110, processing unit 1130 and I/O unit 1140 can also make memory access calls to a memory 1160. Processing system components 1110, 1130, 1140, 1160 perform their functions based on configuration data stored by nonvolatile PCM memory 1170 integrated into respective processing system components 1110, 1130, 1140, 1160.

Configuration data can be loaded into non-volatile memory for runtime accesses. Configuration data can be used to tune PCRAM and other components (e.g., power control 1110, processing unit 1130 or I/O unit 1140) behavior in a design, test, or as-manufactured context. Configuration data can comprise, for example, information used by processing system components to operate external units 1150; redundancy information, used to redirect accesses (read and write requests) from defective or otherwise inoperative memory cells to redundant (backup) memory cells; trim information, generally used to alter the state of an existing topology when device features as-manufactured show variation—which can be expected within some degree of statistical distribution—that can be corrected using measures built into the device; test information used to implement test functions, e.g., for device design, design testing or as-manufactured quality assurance purposes; or to change timing (e.g., sense amp timing, or setup and hold timing in a data path), internal supply voltages, whether ECC (error correction) or other memory or other component functionality is activated, or other component operation parameters (such as word length, instruction set, or whether to use single-ended or MDMB sensing in a particular context).

It will incidentally be noted that the number of N-level cells necessary to encode all possible N-level transformations will be '$\log_N(N!)$', i.e. the base-N logarithm of N-factorial, rounded up to the next integer.

According to some but not necessarily all embodiments, there is provided: A method of operating a phase change memory, comprising: when data is to be written to a range of phase change memory cells: determining which of at least two transformations of said data is optimal for writing to said range of phase change memory cells; writing said data to said range of phase change memory cells using the appropriate transformation; and writing a selection symbol to indicate the transformation used in said step of writing said data to said range of phase change memory cells; and when data is to be read from a range of phase change memory cells: reading from a selection symbol to determine what transformation was used to write the data to the range of phase change memory cells; and reading the data from said range of phase change memory cells according to the appropriate transformation determined from said step of reading from a selection symbol.

According to some but not necessarily all embodiments, there is provided: A method of writing and reading phase change memory cells, comprising: when data is to be written, comparing data to one or more of a set of predefined transformations of said data to determine which will be optimal to write, and writing said phase change memory cells appropriately with or without transformation; wherein said step of writing writes at least one said phase change memory cell which indicates any transformation; and when data is to be read, reading at least one said phase change memory cell to determine any transformation, and reading data from said phase change memory cells appropriately according to any transformation determined in said step of reading at least one said phase change memory cell.

According to some but not necessarily all embodiments, there is provided: A method of writing phase change memory cells, comprising: determining which of a plurality of transformations of data will be most optimal to write to a range of phase change memory cells; writing the appropriate transformation of data to said range of phase change memory cells; and writing a selection symbol to indicate the transformation of data used; wherein said plurality of transformations of data encode substantially identical data.

According to some but not necessarily all embodiments, there is provided: A method of operating a phase change memory, comprising: when data is to be written to an array of phase change memory cells: determining which of several transformations of a data chunk is optimal to write; determining a write address where the transformed data chunk is to be written to the array of phase change memory cells; writing a selection symbol corresponding to the optimal transformation to a data location associated with said step of determining a write address; and writing the optimal transformation to the array of phase change memory cells at the write address; and when data is to be read from an array of phase change memory cells: retrieving a read address and a selection symbol corresponding to a data chunk; reading the data chunk from the array of phase change memory cells according to the read address; using the selection symbol to apply an appropriate inverse transformation to the data chunk, to thereby retrieve a corrected data chunk; and returning said corrected data chunk.

According to some but not necessarily all embodiments, there is provided: A phase change memory device, comprising: an array of phase change memory cells; a data lookup table; a write component, configured to determine which of several transformations of a data chunk is optimal to write to said array; determine a write address in said data lookup table where the transformed data chunk is to be written to said array; write a selection symbol corresponding to the optimal transformation to a location in said data lookup table associated with said write address; and write the optimal transformation to the array at said write address; a read component, configured to retrieve a read address, and a selection symbol corresponding to a data chunk, from a data lookup table; read the data chunk from the array according to the read address; use the selection symbol to apply an appropriate inverse transformation to the data chunk, to thereby retrieve a corrected data chunk; and return said corrected data chunk.

According to some but not necessarily all embodiments, there is provided: A phase change memory, comprising: a write component which determines which of at least two data transformations is optimal to write to a range of phase change memory cells, writes the optimal data transformation to the range of phase change memory cells, and writes a selection symbol accordingly; a read component which reads from a selection symbol to determine what data transformation was used to write a range of phase change memory cells, and reads data from the range of phase change memory cells according to the data transformation indicated by the selection symbol.

According to some but not necessarily all embodiments, there is provided: A system, comprising: a phase-change memory unit, a processor which executes programmable instruction sequences, and an input/output unit; wherein said processor determines which of at least two transformations of data from said input/output unit is optimal to write to a data chunk in said phase-change memory unit, and uses a write component to write the optimal transformation of said data to the data chunk, and also to write a selection symbol to said data chunk accordingly; and wherein said processor directs a read component to read from a selection symbol for a data chunk in said phase-change memory unit to determine what transformation was used to write data to the data chunk, and said read component reads data from the data chunk to said input/output unit, according to the data transformation indicated by the selection symbol.

According to some but not necessarily all embodiments, there is provided: A system, comprising: a phase-change memory unit, a processor which executes programmable instruction sequences, and an input/output unit; a write component which determines which of at least two transformations of data from said input/output unit is optimal to write to a data chunk in said phase-change memory unit, and writes the optimal transformation of said data to the data chunk, and writes a selection symbol to said data chunk accordingly; a read component which reads from a selection symbol for a data chunk in said phase-change memory unit to determine what transformation was used to write data to the data chunk, and reads data from the data chunk to said input/output unit, according to the data transformation indicated by the selection symbol.

According to some but not necessarily all embodiments, there is provided: A method of operating a phase change memory system, comprising: using a processor to direct a write component to determine which of at least two transformations of data from an input/output unit is optimal to write to a data chunk in a phase-change memory unit, and write the optimal transformation of said data to the data chunk, and writes a selection symbol to said data chunk accordingly; using a processor to direct a read component to read from a selection symbol for a data chunk in said phase-change memory unit to determine what transformation was used to write data to the data chunk, and read data from the data chunk to said input/output unit, according to the data transformation indicated by the selection symbol.

According to some but not necessarily all embodiments, there is provided: Methods and systems for phase change memories and arrays with improved write characteristics. If a data word can be more efficiently written by e.g. exchanging SETs and RESETs, it is written as such on the fly, and e.g. a bit of overhead is written to indicate the transformation. This has a surprising synergy with phase change memory as SET operations usually take longer and consume more power than do RESET operations. In one sample embodiment of multilevel phase change memory, states intermediate between SET and RESET can be even less desirable to write than SETs, as they take more precision than do the extreme states of SET and RESET, so that a desirable transformation can be to exchange intermediate states for extreme states.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

It will be understood that the size of each data chunk can vary between embodiments (but will usually be fixed within an embodiment).

In some sample embodiments, one or more primary factors can be considered in deciding an optimal transformation. One or more secondary factors can also be considered if e.g. two or more optimal transformations are substantially equivalent under primary factors.

In some sample embodiments, factors which can be used to decide the optimum (or optimal) transformation can include optimizing for speed or optimizing for power. Transformation logic can also selectably optimize for speed OR for power. Optimization factors can also include e.g. reducing the frequency of re-writes from write-verify operations. Another possible approach considers the "available time", e.g. the time that can be allocated towards the write operations. In some sample embodiments, balancing of cell wearout is also considered.

In some sample embodiments, at least some programming history of a PCM cell can be recorded, and this programming history of the cell can be used in deciding transformations. Write operations, including SET and RESET operations, are physical transformations in phase change memory technologies, and a PCM cell can eventually wear out from repeated use. In some contemplated embodiments, cell histories can be considered in choosing transformations. This can be particularly useful e.g. in ensuring even PCM cell wearout across a device.

In some sample embodiments, an optimizable factor can be to reduce the likelihood of read-after-write operations, e.g. by minimizing the population of intermediate states, which can be more difficult to write and can thus require more frequent write-verify operations.

One contemplated sample embodiment can selectably optimize for speed OR for power. During normal operation, a sample unit can e.g. optimize for speed, but when, for example, the unit is writing to memory in preparation for going into sleep mode, operations can instead take longer and optimize for power.

The correspondence between a selection symbol and the associated transformation can be chosen in a number of ways, and the examples given here are not intended to be exclusive or limiting.

In one contemplated sample embodiment, one cell of a selection symbol discriminates among potential transformations e.g. by indicating the level to which an initial SET-state was transformed, or e.g. the initial level that was transformed to a SET state.

In another contemplated sample embodiment having a selection symbol consisting of a single n-level cell in an n-level PCM, at most n transformations (including the null case of no transformation) are contemplated.

In one contemplated n-level sample embodiment, fewer than all possible encoding permutations for a given data chunk (i.e. n!) can be considered.

In some sample embodiments, the transformation decision can be whether more SETs or RESETs are required.

In some sample embodiments, a selection symbol can be e.g. as many bits as can be encoded by a single PCM cell. In other sample embodiments, a selection symbol can be a single bit. In still other sample embodiments, a selection symbol can comprise multiple PCM cells.

In some sample embodiments, the selection symbol can be adjacent to the respective contiguous data chunk. In other sample embodiments, a data chunk can be contiguous or noncontiguous. The selection symbol can be incorporated into the addressing process, so that the address (or addresses) of a data word can be retrieved simultaneously and co-incidentally with the transformation state of the data word.

In many sample embodiments, as the size of the data chunk indexed by a transformation symbol increases, the distribution of the data (e.g. between SET-states and RESET-states in a single-bit embodiment) will approach parity, and the resultant potential gain from transformation will approach zero. However, in some sample embodiments, an unequal distribution of data can be known to exist a priori, so that some significant gain can still result from a much higher data-cell-to-selection-cell ratio than is necessarily the case in many normal use cases.

A unique factor of phase change memories is that SET states and RESET states (much less any intermediate states in multi-bit architectures) do not necessarily correspond consistently to logical "0" and logical "1". This can make precise analogies to conventional logical operations somewhat difficult. In one single-bit sample embodiment, the result of XNOR(SET, RESET) is defined as RESET, a SET-state selection bit is chosen to indicate non-transformation, and the transformation operation is taken to be an XNOR operation. However, other interpretations of the transformation operation are of course possible. For example, in one sample single-bit architecture, a single-bit transformation operation can be interpreted e.g. as an XOR operation or e.g. as an XNOR operation (depending on how transformations are encoded into a selection symbol, and on how the result of XOR(SET, RESET) is defined). Other interpretations of transformation operations, both single-bit and multi-bit, are also contemplated.

In some sample embodiments, a given transformation can be applied to only some of the cells in a given data chunk. In one sample embodiment, four selection cells are allocated to the selection symbol for a data chunk, which is e.g. 16 data cells. Each of these selection cells can indicate, e.g., a class of data cells (modulo four) to transform. In another sample embodiment, one selection cell can indicate e.g. that odd-numbered cells will be transformed while another selection cell can indicate e.g. that even-numbered cells will be transformed. In another sample embodiment, each selection cell can indicate that a respective nybble will be transformed.

In one contemplated alternative embodiment, destructive neighboring cell effects can be a factor in deciding transformations. If e.g. a SET operation and a RESET operation are to be written simultaneously in adjacent cells, the heat of the SET operation can "blur" the RESET operation, resulting in the state of the latter cell being closer to a SET state than to the desired RESET state. It is contemplated that minimization of such destructive effects can be a possible secondary consideration in choosing transformations.

In one contemplated embodiment, temperature dependencies can be taken into account in choosing transformations. In a high-temperature ambient environment, tightly-packed intermediate states in a multi-state architecture can be increasingly difficult to discern with higher temperatures. It is contemplated that transformations can effectively increase the spacing between multi-state levels, e.g. by effectively removing certain intermediate levels to more-sparsely-distributed levels. In one contemplated embodiment, this can be facilitated by a flexible architecture which can allocate extra memory cells towards "unpacking" some of the undesirable tightly-packed intermediate multi-level states.

In one contemplated embodiment, operations going from a more-SET-like state to a more-RESET-like state can be easier to write than the inverse operation, and can be preferentially selected for in optimization.

In one contemplated embodiment, transformations of at least some portion of the address are also enabled.

Additional general background, which helps to show variations and implementations, may be found in the following publications, all of which are hereby incorporated by reference: Lam, Chung. "Phase Change Memory: A Replacement or Transformational Memory Technology," IEEE Workshop on Microelectronics and Electron Devices (WMED), c. 2011. Choi, Youngdon, et al. "A 20 nm 1.8V 8 Gb PRAM with 40 MB/s Program Bandwidth." ISSCC 2012/Session 2/High Bandwidth DRAM & PRAM/2.5. c. 2012.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be combined synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. Provisional Pat. Nos. 61/694,217; 61/694,220; 61/694,221; 61/694,223; 61/694,224; 61/694,225; 61/694,228; 61/694,234; 61/694,240; 61/694,242; 61/694,243; 61/694,245; 61/698,532; 61/698,539; 61/698,544; 61/699,184; 61/784,208; 61/784,298; 61/784,341; 61/784,392; 61/784,445; 61/784,480; 61/784,523; 61/784,550; 61/784,579; 61/784,602; 61/813,236; 61/814,413; 61/814,414; 61/814,415; 61/814,417; 61/814,419; 61/814,422; 61/814,424; 61/814,425; 61/815,164; 61/815,947; 61/816,045; 61/816,825; 61/820,385; 61/826,231; 61/828,361; 61/829,579; 61/831,314; U.S. application Ser. Nos. 13/869,065; 13/869,074; 13/869,082; 13/869,088; 13/869,108; 13/869,134; 13/869,231; 13/869,243; 13/869,338; 13/869,377; 13/869,486; 13/869,519; 13/869,632; 13/869,679; 13/869,735; 13/869,752; 13/869,827; and 13/869,843.

The claims as filed are intended to be as comprehensive as possible, and NO subject matter is intentionally relinquished, dedicated, or abandoned.

What is claimed is:

1. A method of operating a phase change memory, comprising:
   when data is to be written to a range of phase change memory cells:
      determining which of at least two transformations of said data is optimal for writing to said range of phase change memory cells;
      writing said data to said range of phase change memory cells using the appropriate transformation; and
      writing a selection symbol to indicate the transformation used in said step of writing said data to said range of phase change memory cells; and
   when data is to be read from a range of phase change memory cells:
      reading from a selection symbol to determine what transformation was used to write the data to the range of phase change memory cells; and
      reading the data from said range of phase change memory cells according to the appropriate transformation determined from said step of reading from a selection symbol.

2. The method of claim 1, wherein the optimal transformation is considered to be the transformation which takes the least energy to write.

3. The method of claim 1, wherein the optimal transformation is considered to be the transformation which takes the least time to write.

4. The method of claim 1, wherein the optimal transformation is considered to be the transformation which takes the least power to write.

5. The method of claim 1, wherein the optimal transformation is considered to be the transformation which selectably takes either the least time or the least power to write.

6. The method of claim 1, wherein one said transformation is the identity transformation; whereby said identity transformation is identical to said data.

7. The method of claim 1, wherein each phase change memory cell is in one of N states, and at most N transformations of data are considered.

8. A method of writing and reading phase change memory cells, comprising:
   when data is to be written, comparing data to one or more of a set of predefined transformations of said data to determine which will be optimal to write, and writing said phase change memory cells appropriately with or without transformation; wherein said step of writing writes at least one said phase change memory cell which indicates any transformation;
   and when data is to be read, reading at least one said phase change memory cell to determine any transformation, and reading data from said phase change memory cells appropriately according to any transformation determined in said step of reading at least one said phase change memory cell.

9. The method of claim 8, wherein the optimal transformation is considered to be the transformation which takes the least energy to write.

10. The method of claim 8, wherein the optimal transformation is considered to be the transformation which takes the least time to write.

11. The method of claim 8, wherein the optimal transformation is considered to be the transformation which takes the least power to write.

12. The method of claim 8, wherein the optimal transformation is considered to be the transformation which selectably takes either the least time or the least power to write.

13. The method of claim 8, wherein one phase change memory cell can be in one of N states, and at most N transformations are considered.

14. The method of claim 8, wherein said set of predefined transformations of said data includes fewer than all possible transformations of said data.

15. The method of claim 8, wherein each of said plurality of transformations of data corresponds to a received data value; and wherein said plurality of transformations of data encode substantially identical information.

16. The method of claim 8, wherein said plurality of transformations of data encode substantially identical data.

17. A method of writing phase change memory cells, comprising:
   determining which of a plurality of transformations of data will be most optimal to write to a range of phase change memory cells;
   writing the appropriate transformation of data to said range of phase change memory cells; and writing a selection symbol to indicate the transformation of data used;
   wherein said plurality of transformations of data encode substantially identical data.

18. The method of claim 17, wherein each phase change memory cell is in one of N states, and at most N transformations of data are considered.

19. The method of claim 17, wherein each of said plurality of transformations of data corresponds to a received data value; and wherein said plurality of transformations of data encode substantially identical information.

20. The method of claim 17, wherein the most optimal transformation is considered to be the transformation which takes the least energy to write.

* * * * *